(12) United States Patent
Jakubowski et al.

(10) Patent No.: US 9,064,733 B2
(45) Date of Patent: Jun. 23, 2015

(54) CONTACT STRUCTURE FOR A SEMICONDUCTOR DEVICE AND METHODS OF MAKING SAME

(71) Applicant: GLOBALFOUNDRIES Inc., Grand Cayman (KY)

(72) Inventors: Frank Jakubowski, Dresden (DE); Juergen Faul, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/590,076

(22) Filed: Jan. 6, 2015

(65) Prior Publication Data

US 2015/0145061 A1    May 28, 2015

Related U.S. Application Data

(62) Division of application No. 13/689,979, filed on Nov. 30, 2012, now Pat. No. 8,956,928.

(51) Int. Cl.
| | |
|---|---|
| *H01L 29/66* | (2006.01) |
| *H01L 27/11* | (2006.01) |
| *H01L 29/423* | (2006.01) |
| *H01L 29/49* | (2006.01) |

(52) U.S. Cl.
CPC ...... *H01L 27/1104* (2013.01); *H01L 29/42356* (2013.01); *H01L 29/4916* (2013.01)

(58) Field of Classification Search
CPC ............... H01L 2924/1437; H01L 21/823475; H01L 21/823871
USPC .......................................................... 438/150
See application file for complete search history.

(56) References Cited

U.S. PATENT DOCUMENTS

| | | | |
|---|---|---|---|
| 5,607,881 | A | 3/1997 | Huang |
| 5,986,328 | A | 11/1999 | Liaw |
| 6,107,642 | A | 8/2000 | Sundaresan |
| 6,146,981 | A | 11/2000 | Chen |
| 7,416,973 | B2 | 8/2008 | Peters et al. |
| 7,449,711 | B2 | 11/2008 | Asano et al. |
| 7,510,960 | B2 | 3/2009 | Toomey |
| 7,678,658 | B2 | 3/2010 | Yang et al. |
| 7,678,690 | B2 | 3/2010 | Richter et al. |
| 8,178,931 | B2 | 5/2012 | Toomey |
| 8,338,292 | B2 | 12/2012 | Tan et al. |
| 2005/0051867 | A1 | 3/2005 | Lee et al. |
| 2008/0048333 | A1 | 2/2008 | Seo et al. |
| 2008/0054392 | A1 | 3/2008 | Toomey |
| 2009/0283853 | A1 | 11/2009 | Huebinger |
| 2010/0001369 | A1 | 1/2010 | Chuang et al. |
| 2010/0087038 | A1 | 4/2010 | Chung et al. |
| 2010/0207213 | A1 | 8/2010 | Tan et al. |
| 2011/0198699 | A1 | 8/2011 | Hung et al. |
| 2012/0211843 | A1 | 8/2012 | Jung et al. |

*Primary Examiner* — Lex Malsawma
(74) *Attorney, Agent, or Firm* — Amerson Law Firm, PLLC

(57) ABSTRACT

A device includes first and second spaced-apart active regions positioned in a semiconducting substrate, an isolation region positioned between and separating the first and second spaced-apart active regions, and a layer of gate insulation material positioned on the first active region. A first conductive line feature extends continuously from the first active region and across the isolation region to the second active region, wherein the first conductive line feature includes a first portion that is positioned directly above the layer of gate insulation material positioned on the first active region and a second portion that conductively contacts the second active region.

24 Claims, 18 Drawing Sheets

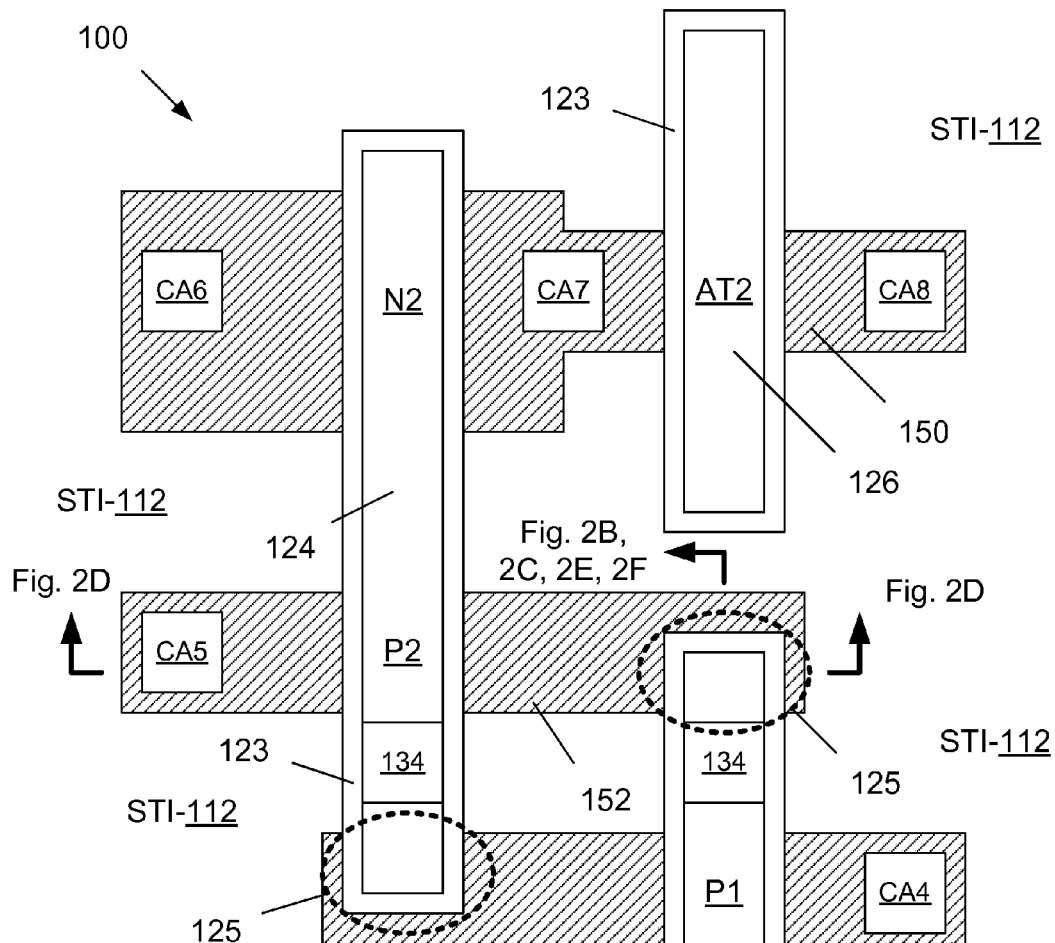
Figure 2A
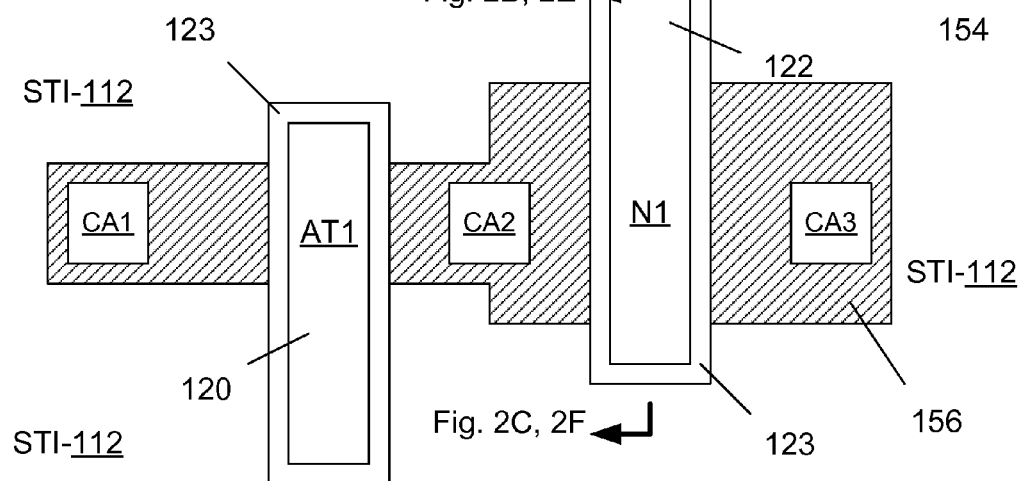

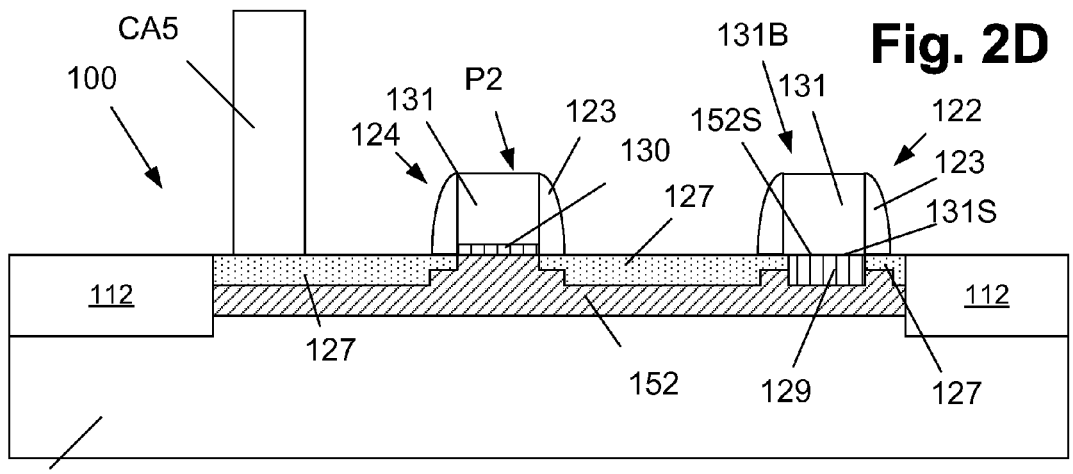
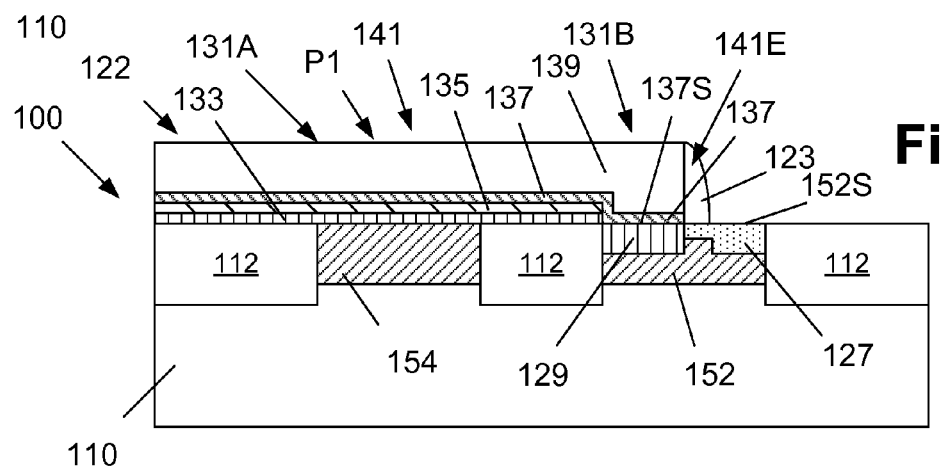
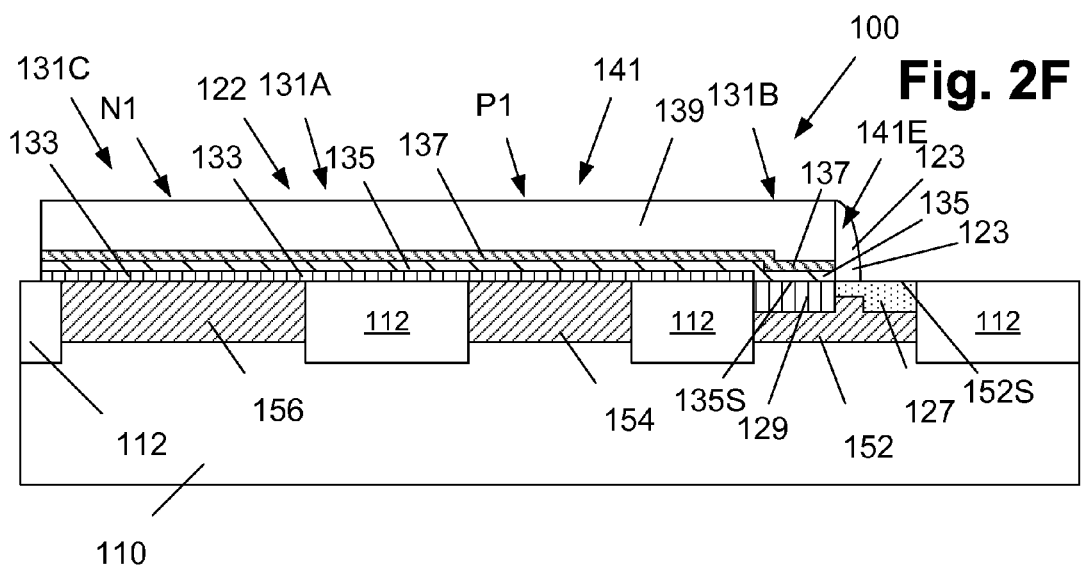

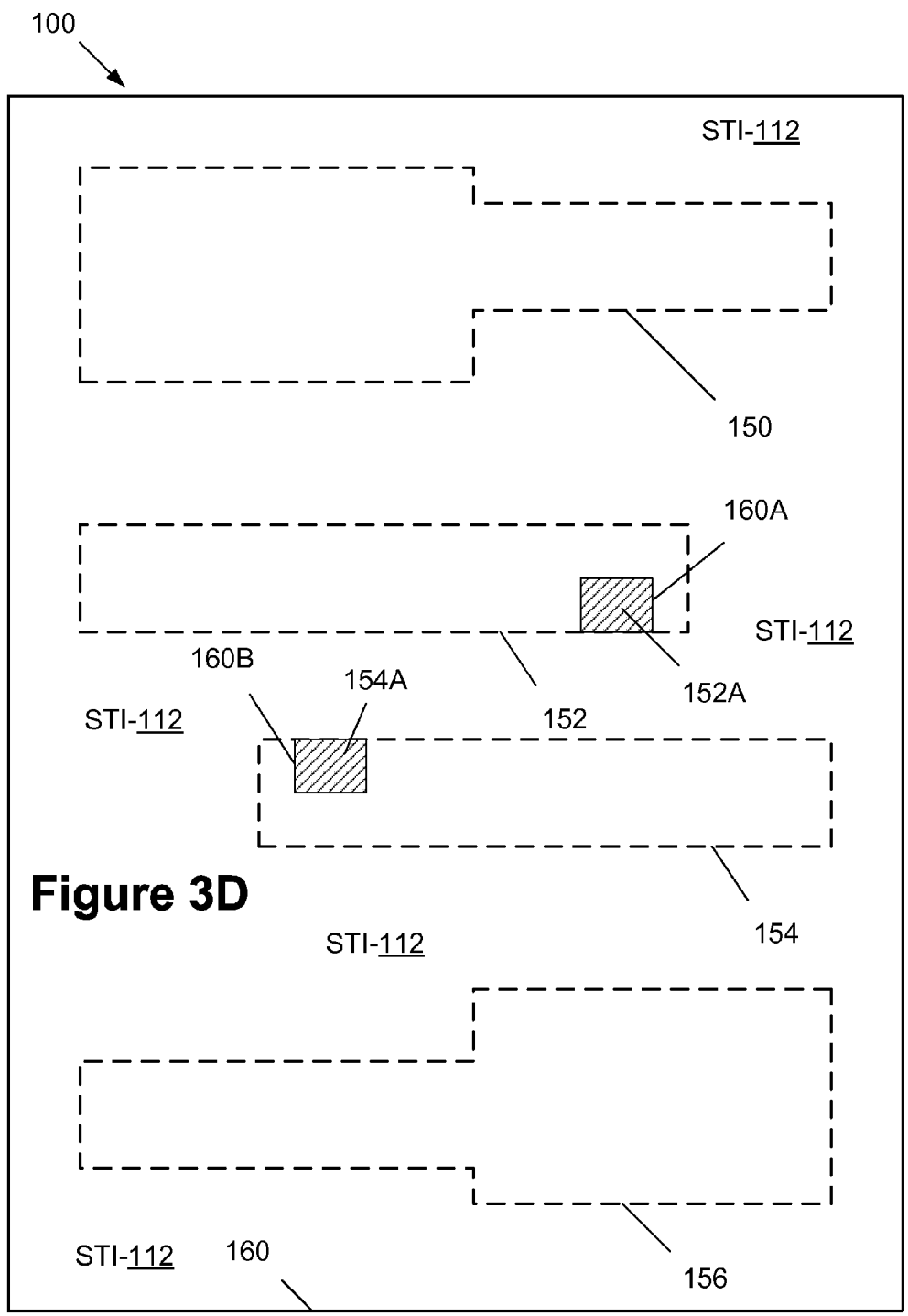

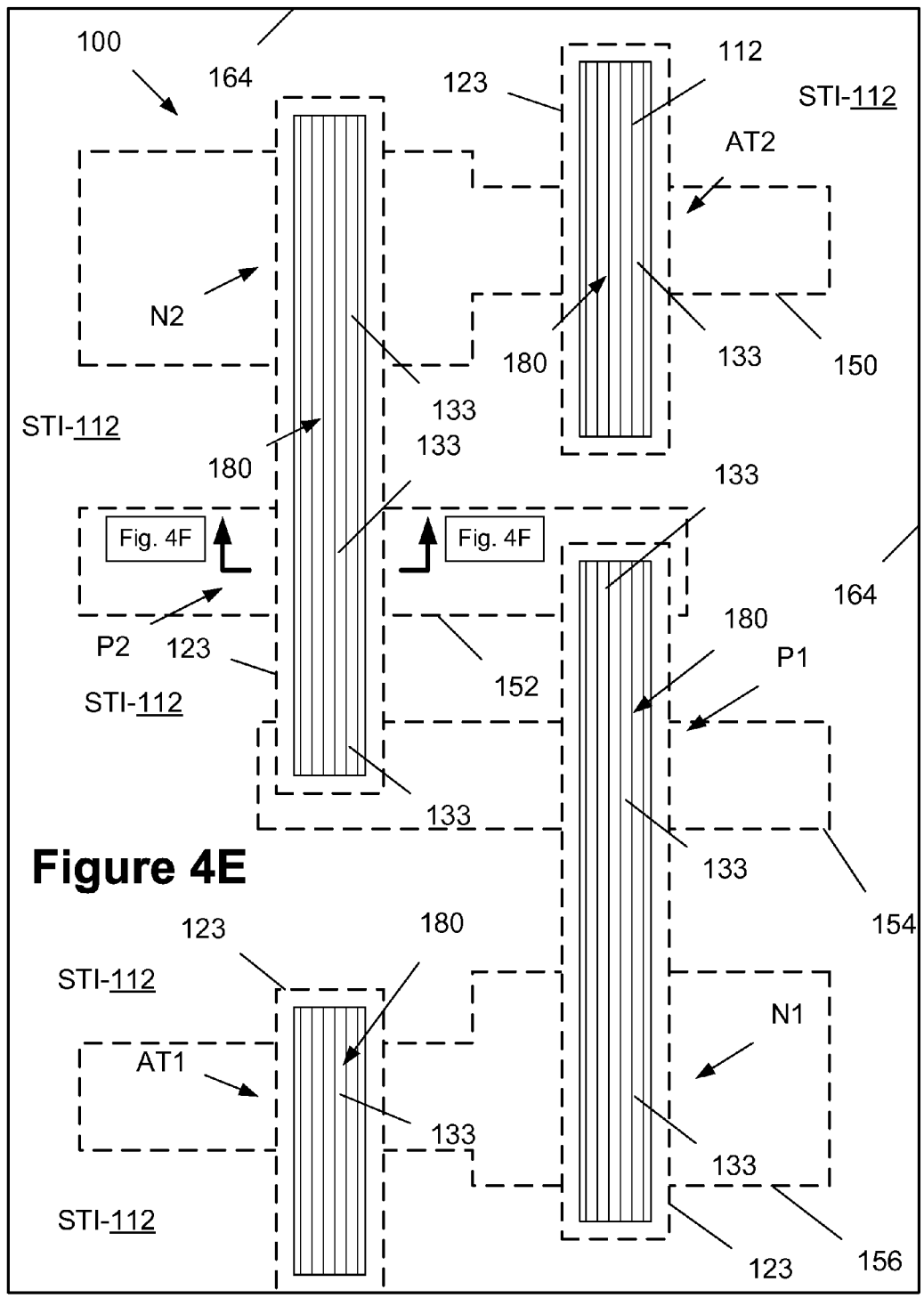

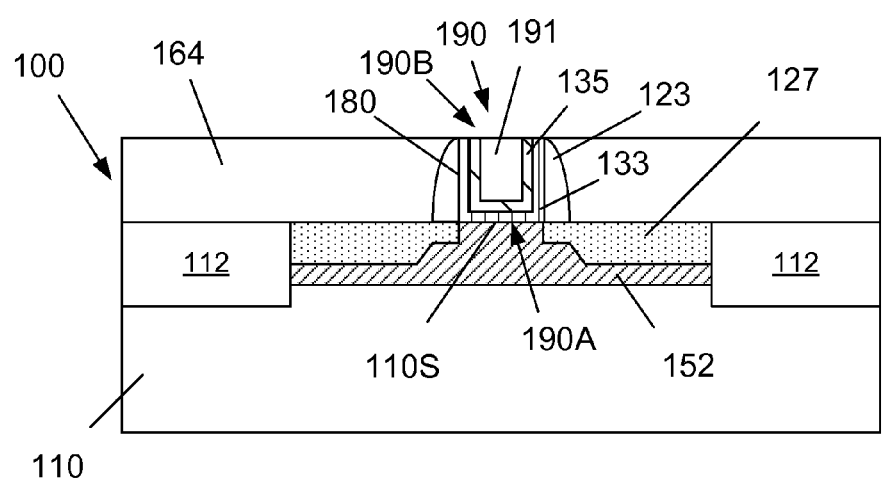

US 9,064,733 B2

CONTACT STRUCTURE FOR A SEMICONDUCTOR DEVICE AND METHODS OF MAKING SAME

CROSS-REFERENCE TO RELATED APPLICATION

This is a divisional of co-pending application Ser. No. 13/689,979, filed Nov. 30, 2012.

BACKGROUND OF THE INVENTION

1. Field of the Invention

The present disclosure generally relates to the manufacture of sophisticated semiconductor devices, and, more specifically, to a novel contact structure for a semiconductor device, such as SRAM memory devices, and various methods of making such a contact structure.

2. Description of the Related Art

Semiconductor memory devices are in widespread use in many modern integrated circuit devices and in many consumer products. In general, memory devices are the means by which electrical information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., the cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Special read/write circuitry is used to access the memory device to store digital information on such a memory device and to determine whether or not a charge is presently stored in the memory device. These program/erase cycles ("P/E cycles") typically occur millions of times for a single memory device over its effective lifetime.

In general, efforts have been made to reduce the physical size of such memory devices, particularly reducing the physical size of components of the memory devices, such as transistors, to increase the density of memory devices, thereby increasing performance and decreasing the costs of the integrated circuits incorporating such memory devices. Increases in the density of the memory devices may be accomplished by forming smaller structures within the memory device and by reducing the separation between the memory devices and/or between the structures that make up the memory device. Often, these smaller design rules are accompanied by layout, design and architectural modifications which are either made possible by the reduced sizes of the memory device or its components, or such modifications are necessary to maintain performance when such smaller design rules are implemented. As an example, the reduced operating voltages used in many modern-day conventional integrated circuits are made possible by improvements in design, such as reduced gate insulation thicknesses in the component transistors and improved tolerance controls in lithographic processing. On the other hand, reduced design rules make reduced operating voltages essential to limit the effects of hot carriers generated in small size devices operating at higher, previously conventional operating voltages.

Making SRAMs in accordance with smaller design rules, as well as using reduced internal operating voltages, can reduce the stability of SRAM cells. Reduced operating voltages and other design changes can reduce the voltage margins which ensure that an SRAM cell remains in a stable data state during a data read operation, increasing the likelihood that the read operation could render indeterminate or lose entirely the data stored in the SRAM cell.

FIGS. 1A-1D depict various aspects of an illustrative prior art SRAM device 10. As shown in FIG. 1A, a typical 6T (six transistors) SRAM memory cell 10 includes two NMOS access or "pass gate" transistors AT1, AT2, two PMOS "pull-up" transistors P1, P2, and two NMOS "pull-down" transistors N1, N2. Each of the PMOS pull-up transistors P1, P2 has its gate connected to the gate of a corresponding NMOS pull-down transistor N1, N2. The drains of the PMOS pull-up transistors P1, P2 have their drains connected to the drains of corresponding NMOS pull-down transistors N1, N2 to form inverters having the conventional configuration. The sources of the PMOS pull-up transistors P1, P2 are connected to a high reference potential, typically $V_{CC}$, and the sources of the NMOS pull-down transistors N1, N2 are connected to a lower reference potential, typically $V_{SS}$ or ground. The gates of the PMOS pull-up transistor P1 and the NMOS pull-down transistor N1, which make up one inverter, are connected to the drains of the transistors P2, N2 of the other inverter. Similarly, the gates of the PMOS pull-up transistor P2 and the NMOS pull-down transistor N2, which make up the other inverter, are connected to the drains of the transistors P1, N1. Hence, the potential present on the drains of the transistors P1, N1 (node NA) of the first inverter is applied to the gates of transistors P2, N2 of the second inverter and the charge serves to keep the second inverter in an ON or OFF state. The logically opposite potential is present on the drains of the transistors P2, N2 (node NB) of the second inverter and on the gates of the transistors P1, N1 of the first inverter, keeping the first inverter in the complementary OFF or ON state relative to the second inverter. Thus, the latch of the illustrated SRAM cell 10 has two stable states: a first state with a predefined potential present on charge storage node NA and a low potential on charge storage node NB; and a second state with a low potential on charge storage node NA and the predefined potential on charge storage node NB. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The stability of an SRAM cell 10 can be quantified by the margin by which the potential on the charge storage nodes can vary from its nominal value while still keeping the SRAM 10 cell in its original state.

Data is read out of the conventional SRAM cell 10 in a non-destructive manner by selectively coupling each charge storage node (NA, NB) to a corresponding one of a pair of complementary bit lines (BL, BL). The selective coupling is accomplished by the aforementioned access transistors AT1, AT2, where each access transistor is connected between one of the charge storage nodes (NA, NB) and one of the complementary bit lines (BL, BL). Word line signals are provided to the gates of the access transistors AT1, AT2 to switch the access transistors ON during data read operations. Charge flows through the ON access transistors to or from the charge storage nodes (NA, NB), discharging one of the bit lines and charging the other of the bit lines. The voltage changes on the bit lines are sensed by a differential amplifier (not shown).

Prior to a read out operation, the bit lines BL, BL are typically equalized at a voltage midway between the high and low reference voltages, typically ½ ($V_{CC}$–$V_{SS}$), and then a signal on the word line WL turns the access transistors AT1, AT2 ON. As an example, consider that NA is charged to a predetermined potential of $V_{CC}$ and NB is charged to a lower potential $V_{SS}$. When the access transistors AT1, AT2 turn ON, charge begins flowing from node NA through access transistor AT1 to bit line BL. The charge on node NA begins to drain off to the bit line BL and is replenished by charge flowing through pull-up transistor P1 to node NA. At the same time, charge flows from bit line BL through pass gate transistor AT2 to node NB and the charge flows from the node NB through the pull-down transistor N2. To the extent that more current flows through pass gate transistor AT1 than flows through pull-up transistor P1, charge begins to drain from the node NA, which, on diminishing to a certain level, can begin turning OFF pull-down transistor N2. To the extent that more current flows through pass gate transistor AT2 than flows through pull-down transistor N2, charge begins to accumulate on charge storage node NB, which, on charging to a certain level, can begin turning OFF pull-up transistor P1. For the SRAM cell's latch to remain stable during such a data reading operation, at least one of the charge storage nodes (NA, NB) within the SRAM cell 10 must charge or discharge at a faster rate than charge flows from or to the corresponding bit line.

FIG. 1B is a plan view of an illustrative prior art SRAM device 10 at an early stage of manufacture. The SRAM device 10 is generally comprised of a pair of illustrative N-type pull-down transistors N1, N2, a pair of illustrative P-type pull-up transistors P1, P2 and a pair of N-type access or pass gate transistors AT1, AT2. The SRAM device 10 includes a plurality of conductive gate structures 20, 22, 24 and 26 that are formed above various active regions 14, 16, 18 and 19. The active regions 14, 16, 18 and 19 are defined in a semiconducting substrate 10 (not shown in FIG. 1B) by illustrative isolation regions 12. Note that the gate structure 22 serves as a shared gate electrode for both of the transistors N1 and P1, while the gate structure 24 serves as a shared gate electrode for both of the transistors N2 and P2. An illustrative sidewall spacer 23 has been formed adjacent each of the gate structures 20, 22, 24 and 26. Although not depicted in FIG. 1B, at this point in the process flow, a plurality of source/drain implant regions 27 have been formed in the active regions 20, 22, 24 and 26, as shown in FIG. 1D. The schematically depicted source/drain regions 27 were formed by performing traditional ion implantation techniques, e.g., by performing an initial extension implant process, followed by forming the spacer 23, and then by performing a deep source/drain implant process.

FIG. 1C depicts the prior art SRAM device 10 after a plurality of conductive contact structures have been formed for the device. More specifically, the SRAM device 10 includes a plurality of conductive contacts CA1-CA3 that conductively contact active region 14, CA4 that conductively contacts active region 16, CA5 that conductively contacts active region 18, and CA6-CA8 that conductively contact active region 19. Also depicted in FIG. 1C is a plurality of so-called CAREC ("CA-Rectangular") contacts, CAREC 1-4. The unit cell of an SRAM 10 only includes two CAREC contacts—CAREC-2 and CAREC-3. The various conductive contact structures shown in FIG. 1C may be formed from traditional materials using traditional techniques for forming such conductive contacts, e.g., damascene type techniques, etc.

FIG. 1D is a cross-sectional view taken where indicated in FIG. 1C. The representative gate structure 22 is comprised of a thermally grown layer of silicon dioxide 30 and a polysilicon gate electrode 31. In general, the CAREC contact structures are dual contact structures. For example, as shown in FIG. 1D, the CAREC-3 structure is conductively coupled to the upper surface 31U and end surface 31E of the gate electrode 31 and to the surface 18S of the active region 18. The use of such CAREC contact structures has become popular due to the increasing demands for greater packing densities on integrated circuit products, i.e., the use of such CAREC contact structures enables the production of more densely packed devices.

Although the use of such CAREC contact structures is widespread, such use is not without problems. For example, the difference in physical size between the CAREC contacts and the other CA contacts may adversely affect the formation of the contact openings as, in general, a larger opening tends to etch at a faster rate than a smaller opening. Such size differences may also adversely impact the formation of the conductive materials in the various contact openings as the aspect ratio for the CA contacts is generally larger than the aspect ratio of the CAREC contacts. Additionally, with the current CAREC formation process and structure, there is a relatively undoped region 21 in the active region under the end 31A of the gate electrode 31. This undoped region 21 provides a ready leakage path and may result in the device having unacceptable levels of leakage current.

The present disclosure is directed towards a novel contact structure for semiconductor devices, such as SRAM memory devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed towards a novel contact structure for semiconductor devices, such as SRAM memory devices, and various methods of making such a contact structure. In one illustrative embodiment, a device is disclosed that includes first and second spaced-apart active regions positioned in a semiconducting substrate, an isolation region positioned between and separating the first and second spaced-apart active regions, and a layer of gate insulation material positioned on the first active region. Additionally, the disclosed device includes, among other things, a first conductive line feature extending continuously from the first active region and across the isolation region to the second active region, wherein the first conductive line feature includes a first portion that is positioned directly above the layer of gate insulation material positioned on the first active region and a second portion that conductively contacts the second active region.

In another exemplary embodiment of the present disclosure, an illustrative device includes first and second spaced-apart active regions positioned in a semiconducting substrate and an isolation region positioned between and separating the first and second spaced-apart active regions. Additionally, a layer of gate insulation material is positioned on the first active region, and the device further includes, among other things, a first conductive line feature extending continuously from the first active region and across the isolation region to the second active region, wherein the first conductive line feature includes a first portion positioned directly above the layer of gate insulation material positioned on the first active region and a second portion that conductively contacts the second active region, the first conductive line feature having an end surface that is positioned above the second active region. Furthermore, a sidewall spacer is positioned on the end surface of the first conductive line feature, a doped source/drain region is positioned in the second active region, and a contact doped region is positioned in the second active region under the second portion of the first conductive line feature.

A further illustrative embodiment disclosed herein is an SRAM device that includes, among other things, first and second spaced-apart active regions positioned in a semiconducting substrate, an isolation region positioned between and separating the first and second spaced-apart active regions, and a first pull-up transistor positioned in and above the first active region, the first pull-up transistor including a first gate insulation layer positioned on the first active region. The disclosed SRAM device further includes a first conductive line feature extending continuously from the first active region and across the isolation region to the second active region, wherein the first conductive line feature includes at least one layer of conductive material. A first portion of the first conductive line feature is positioned directly above the first gate insulation layer of the first pull-up transistor positioned on the first active region and a second portion of the first conductive line feature conductively contacts the second active region. Additionally, a second pull-up transistor is positioned in and above the second active region, the second pull-up transistor including a second gate insulation layer positioned on the second active region. Furthermore, the SRAM device also includes a second conductive line feature extending continuously from the second active region and across the isolation region to the first active region, wherein the second conductive line feature includes at least one layer of conductive material. A first portion of the second conductive line feature is positioned directly above the second gate insulation layer of the second pull-up transistor positioned on the second active region and a second portion of the second conductive line feature conductively contacts the first active region.

BRIEF DESCRIPTION OF THE DRAWINGS

The disclosure may be understood by reference to the following description taken in conjunction with the accompanying drawings, in which like reference numerals identify like elements, and in which:

FIGS. 2A-2F depict various illustrative embodiments of the novel contact structure disclosed herein;

FIGS. 3A-3E depict one illustrative embodiment of a method of forming the novel contact structure disclosed herein on an illustrative SRAM device wherein the gate structures of the transistors of the SRAM device are formed using a so-called "gate-first" technique; and FIGS. 4A-4I depict one illustrative embodiment of a method of forming the novel contact structure disclosed herein on an illustrative SRAM device wherein the gate structures of the transistors of the SRAM device are formed using a so-called "gate-last" or "replacement gate" technique.

Figure 1A:
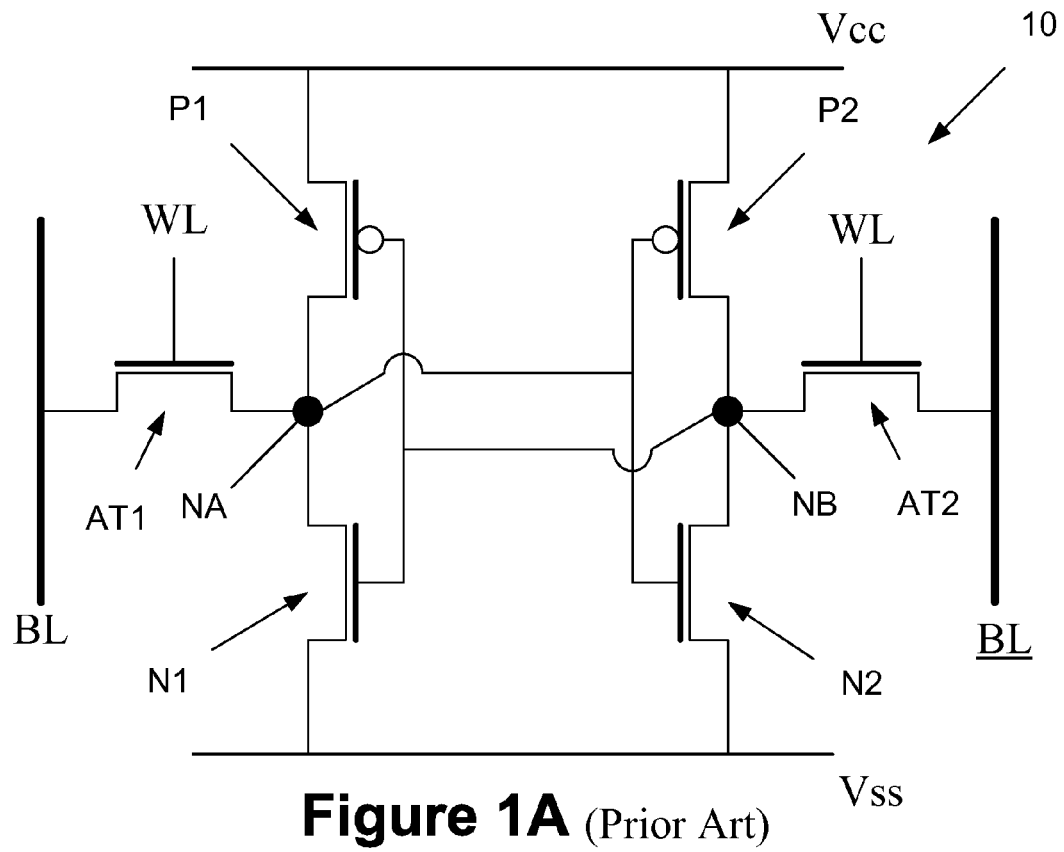
FIGS. 1A-1D schematically depict an illustrative prior art SRAM memory device with a CAREC contact structure.
Figure 1D:
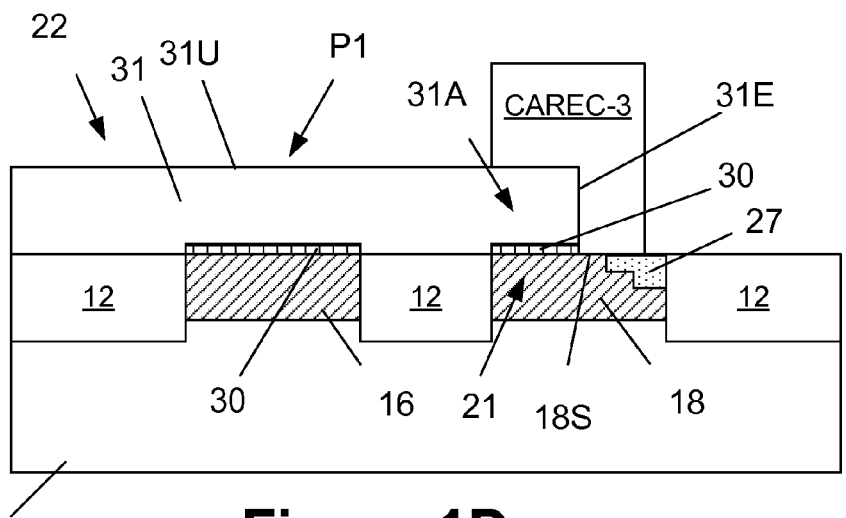
Figure 1B:
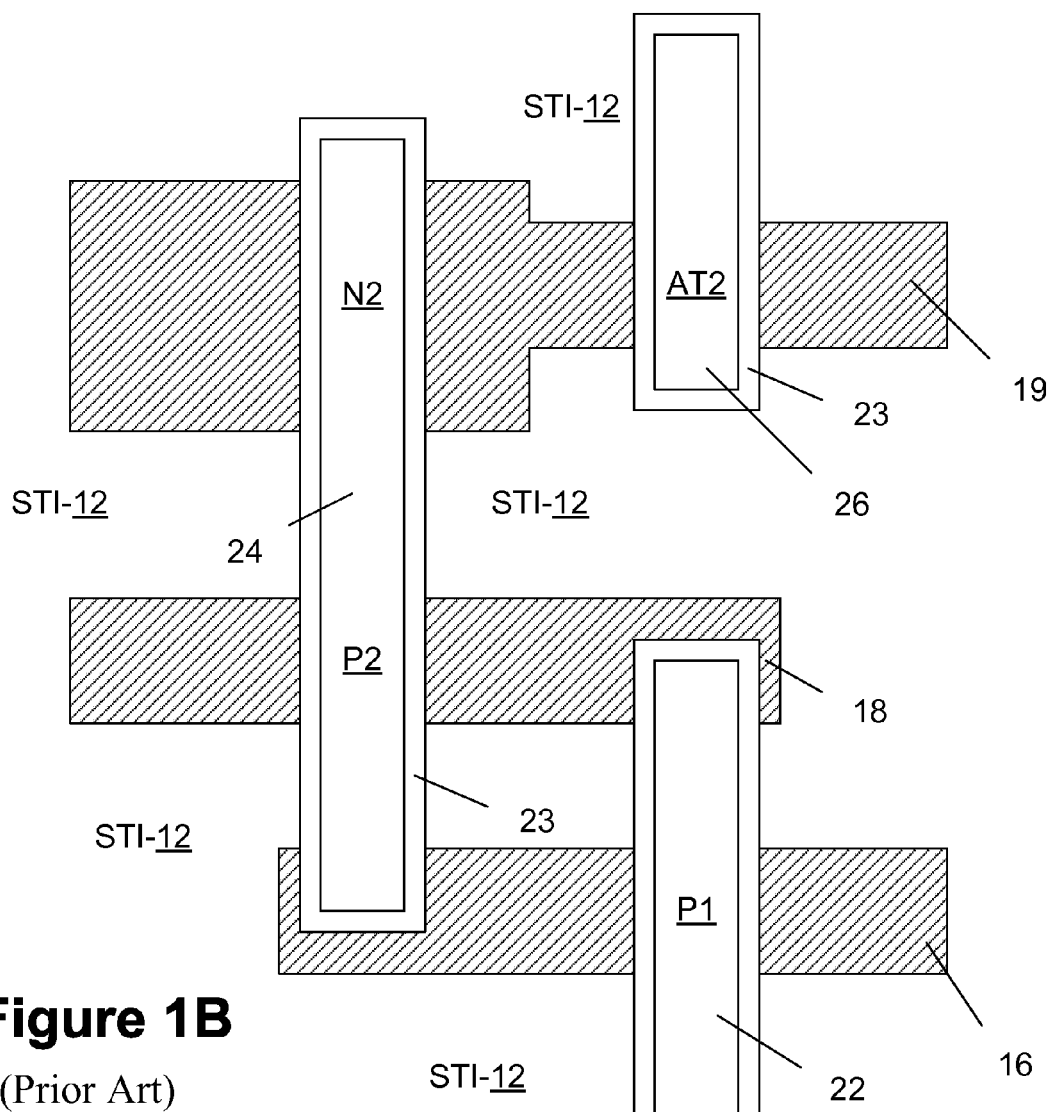

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to a novel contact structure for semiconductor devices and various illustrative methods of making such devices. The inventions disclosed herein will be described with reference to a generic SRAM device. However, after a complete reading of the present application, those skilled in the art will readily appreciate that the subject matter disclosed herein may also be applied to semiconductor devices other than SRAM memory devices, such as, DRAMs, embedded DRAMs, flash cells, etc. Thus, the fact that the present subject matter is disclosed in the context of the formation of an illustrative SRAM memory device should not be considered as a limitation of the inventions disclosed herein. With reference to the attached drawings, various illustrative embodiments of the devices and methods disclosed herein will now be described in more detail.

FIGS. 2A-2F depict one illustrative example of a novel process flow for producing an improved memory device, such as an illustrative SRAM device. However, after a complete reading of the present application, those skilled in the art will readily appreciate that the subject matter disclosed herein may also be applied to devices other than SRAM memory devices, such as dual-port bit cells, etc. Thus, the fact that the present subject matter is disclosed in the context of the formation of an illustrative SRAM memory device should not be considered as a limitation of the inventions disclosed herein.

Figure 1C:
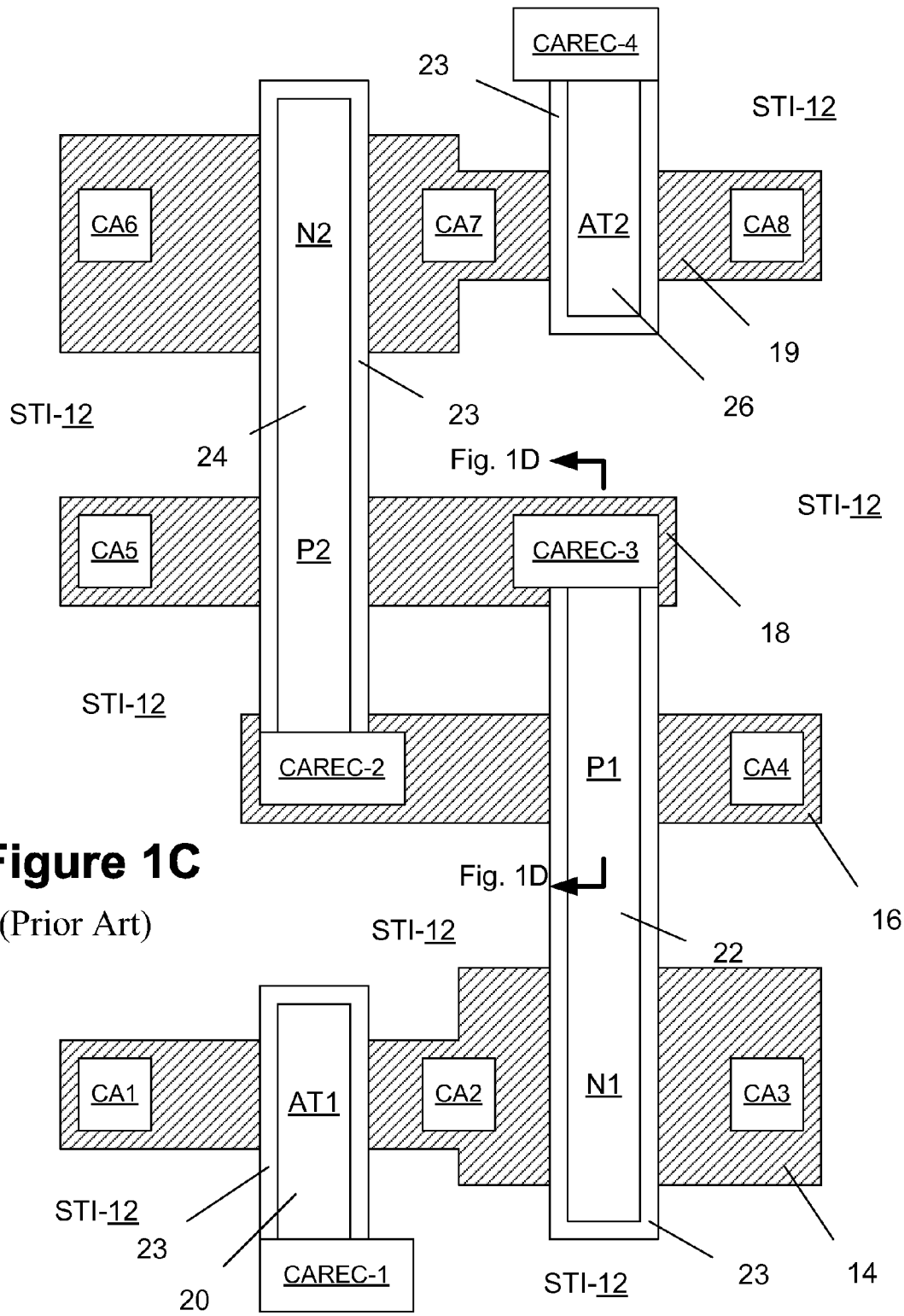
Figure 2B:
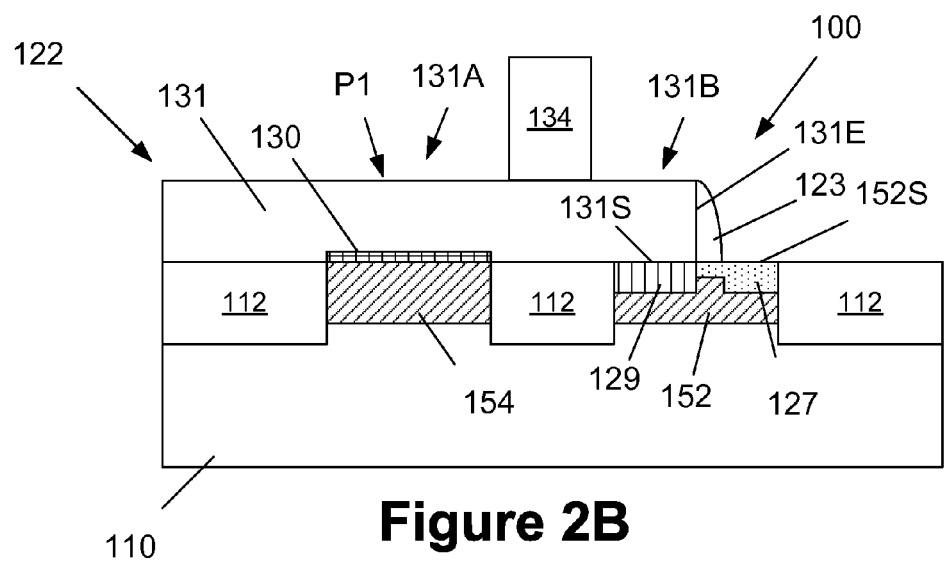

FIGS. 2A-2F depict various illustrative embodiments of the novel contact structure 100 disclosed herein. FIG. 2A is a plan view of an illustrative SRAM device that is generally comprised of a pair of illustrative N-type pull-down transistors N1, N2, a pair of illustrative P-type pull-up transistors P1, P2 and a pair of N-type access or pass gate transistors AT1, AT2. The general functions performed by these various transistors in a typical SRAM memory device are well known to those skilled in the art. The SRAM device includes a plurality of conductive gate structures 120, 122, 124 and 126 that are formed above various active regions 150, 152, 154 and 156 that are defined in a semiconducting substrate 110 (not shown in FIG. 2A) by illustrative isolation regions 112. Note that the gate structure 122 serves as a shared gate electrode for both of the transistors N1 and P1, while the gate structure 124 serves as a shared gate electrode for both of the transistors N2 and P2. Also depicted in FIG. 2A are a plurality of conductive contacts CA1-CA3 that conductively contact active region 156, CA4 that conductively contacts active region 154, CA5 that conductively contacts active region 152, and CA6-CA8 that conductively contact active region 150. As discussed more fully below, in the illustrative case where the novel contact structure disclosed herein is implemented on an SRAM device, the novel contact structure will be used to make conductive contact to the active regions 152, 154 in the areas generally indicated by the dashed lines 125 in FIG. 2A. Note that, in this example, the CAREC-2 and CAREC-3 contacts that were employed on the prior art SRAM device shown in FIG. 1C are not employed on the novel SRAM device depicted in FIG. 2A due to the use of the novel contact structures disclosed herein. Also depicted in FIG. 2A is a plurality of contacts 134 that are conductively coupled to the gate structures 122, 124. As will be described more fully below, due to the use of the novel contact structures disclosed herein, the contacts 134 may be positioned at any desired location along the gate structures 122, 124.

Figure 2C:
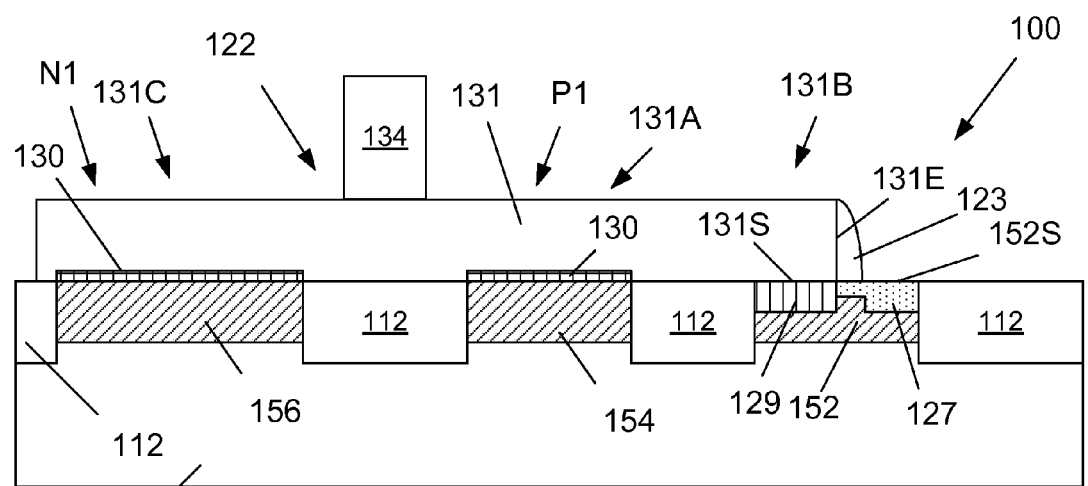

Various cross-sectional views are taken where indicated in FIG. 2A. FIGS. 2B-2D depict an illustrative example where the conductive gate structures 120, 122, 124 and 126 are formed using a gate insulation layer 130, comprised of, for example, silicon dioxide, and a gate electrode 131 comprised of polysilicon. FIGS. 2E-2F depict an illustrative example, wherein the conductive gate structures 120, 122, 124 and 126 are comprised of a high-k (k value of 10 or greater) gate insulation layer 133, a plurality of metal layers 135, 137 and a polysilicon layer 139. In one illustrative embodiment, the novel contact structure 100 disclosed herein involves conductively contacting an active region formed in the substrate 110, e.g., active region 152, with a conductive material that is part of the conductive gate electrode for a transistor device, such as the transistor P1, that is formed in and above another active region, e.g., active region 154, that is spaced apart from the active region 152. When the phrase "conductively contact" or "conductively coupled" is used herein and in the claims to describe the connection between a portion of the gate electrode and an active region or another structure, is should be understood to cover situations where the gate electrode material physically contacts the active region as well as situations where a barrier material may be formed between the material of the gate electrode and the active region. For example, in the case where the final gate electrode structure is comprised of a layer of aluminum, and it is desired that this layer of aluminum conductively contact an active region, a barrier metal, such as titanium, may be formed on the exposed active region prior to forming the layer of aluminum on the layer of titanium.

FIGS. 2B-2C are cross-sectional views taken along the long axis (i.e., in the gate width direction of the transistors N1, P1) of a representative gate structure 122. As shown in FIG. 2B, the active regions 152, 154 are defined in the substrate 110 by the isolation regions 112. In one illustrative embodiment, the semiconducting substrate 110 may be a bulk semiconductor material or it may have a silicon-on-insulator (SOI) configuration comprised of bulk silicon, a buried insulation layer (commonly referred to as a "BOX" layer) and an active layer (in and above which semiconductor devices are formed), which may also be a silicon material. Of course, the present invention may also be employed when the substrate 110 is made of semiconducting materials other than silicon and/or it may be in another form, such as a bulk silicon configuration. Thus, the terms "substrate" or "semiconducting substrate" should be understood to cover all forms of semiconductor structures and materials.

In the embodiment depicted in FIG. 2B, the gate structure 122 is comprised of a thermally grown layer of silicon dioxide 130 and a conductive gate electrode 131 comprised of ploysilicon. In this example, a surface 131S of the conductive gate electrode 131 conductively contacts a surface 152S of the active region 152. Also note that the end surface 131E of the conductive gate electrode 131 is protected by the spacer 123. Thus, the gate electrode 131 is a conductive line feature that has a first portion 131A positioned above the gate insulation layer 130 formed on the active region 154 (where it functions as a gate electrode for transistor P1) and a second portion 131B that conductively contacts the active region 152.

Also depicted in FIG. 2B are schematically depicted source/drain regions 127 that have been formed in the active region 152 using a P-type dopant material (for this particular application). The implant regions 127 were formed by performing traditional ion implantation techniques, e.g., by performing an initial extension implant process, followed by forming the spacer 123 and then by performing a deep source/drain implant process. In the depicted example, the novel contact structure 100 also involves formation of a doped region 129 as part of the process of forming the contact structure 100, as will be described more fully below. Depending upon the particular application, the doped region 129 may be doped with P-type or N-type dopant materials. Also depicted in FIGS. 2B-2C is an illustrative contact structure 134 that is conductively coupled to the gate electrode 131. In the depicted example, the contact 134 is laterally positioned above the isolation region 112 between the active regions 152, 154. However, as noted above, the contact 134 may be positioned at any desired lateral location along the gate electrode 131. Relative to FIG. 2B, in FIG. 2C, the cross-sectional view has been lengthened so as to show a cross-sectional view of the N1 transistor. Additionally, in FIG. 2C, the contact 134 to the gate electrode 131 is laterally positioned above the isolation region 112 between the active regions 154 and 156 (note, this arrangement is not depicted in FIG. 2A). In this embodiment, a third portion 131C of the conductive line feature 131 serves as the gate electrode for transistor N1. The processing described above for the gate structure 122 applies equally to the gate structure 124 for the transistor P2 except that the second portion 131B of the conductive line 131 contacts the active region 154, as is indicated in FIG. 2A.

FIG. 2D is a cross-sectional view taken where indicated in FIG. 2A. The gate structure 124 of the transistor P2 is comprised of the gate electrode 131 positioned above the gate insulation layer 130. Note that the gate electrode 131 of the gate structure 122 contacts the surface 152S of the active region 152 to thereby form one illustrative embodiment of the novel contact structure 100 disclosed herein. Also depicted in FIG. 2D are the previously described doped regions 127, 129 and the illustrative contact CA5.

FIGS. 2E-2F are cross-sectional views taken along the long axis (i.e., in the gate width direction of the transistors N1, P1) of the gate structure 122. As noted previously, FIGS. 2E-2F depict an illustrative example wherein the conductive gate structures 120, 122, 124 and 126 are comprised of a high-k (k value of 10 or greater) gate insulation layer 133, a gate electrode that is generally designated 141 is comprised of a plurality of metal layers 135, 137 and a polysilicon layer 139. In this example, one of the layers of conductive materials that make up the gate electrode 131 of the gate structures will conductively contact the surface 152S of the active region 152. Also note that, as with the previous embodiment, the end surface 141E of the gate electrode 141 is protected by the spacer 123. In the example depicted in FIG. 2E, a surface 137S of the second metal layer 137 conductively contacts the surface 152S of the active region 152. In embodiment depicted in FIG. 2F, the surface 135S of the first metal layer 135 conductively contacts the surface 152S of the active region 152. Although not depicted in the drawings, if desired, in the embodiments shown in FIGS. 2E-2F, the device may be manufactured such that the active region 152 is contacted by the polysilicon material 139 instead of either the first or second metal layers 133, 135. Also depicted in FIGS. 2E-2F are the previously described doped regions 127, 129. The contact structure 134 has been omitted in FIGS. 2E-2F. Relative to FIG. 2E, in FIG. 2F, the cross-sectional view has been lengthened so as to show a cross-sectional view of the N1 transistor.

Figure 3A:
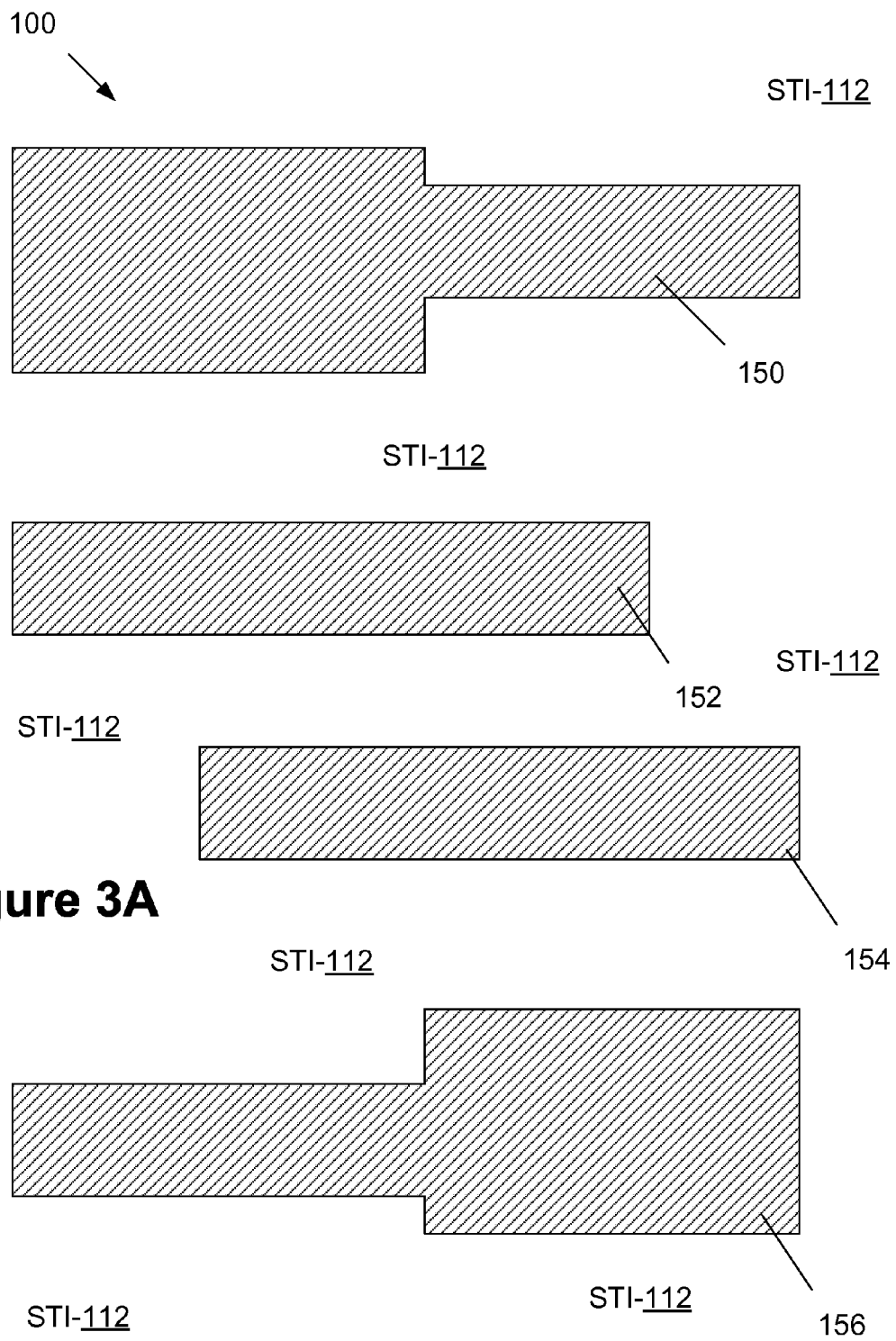
Figure 3B:
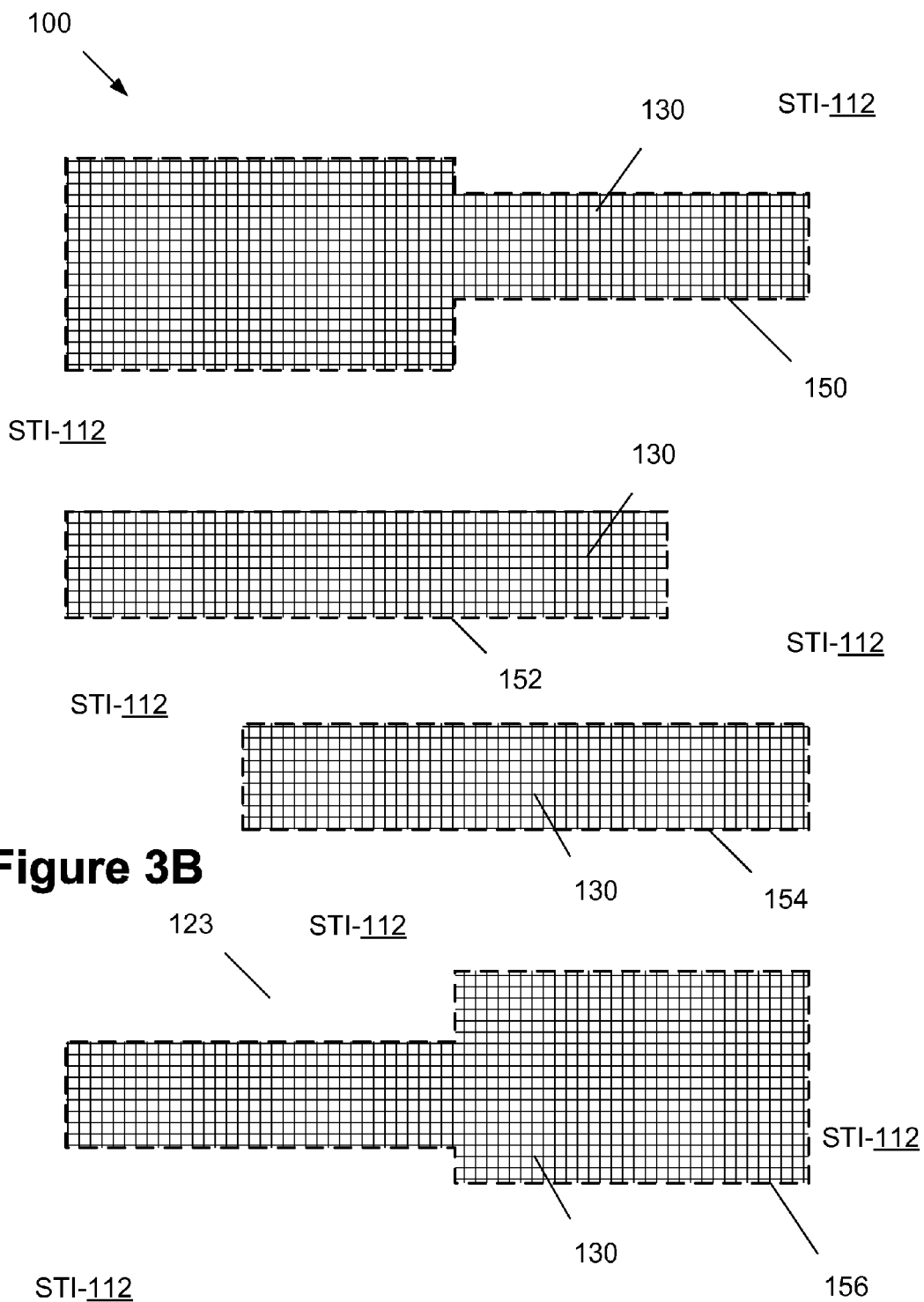
Figure 3C:
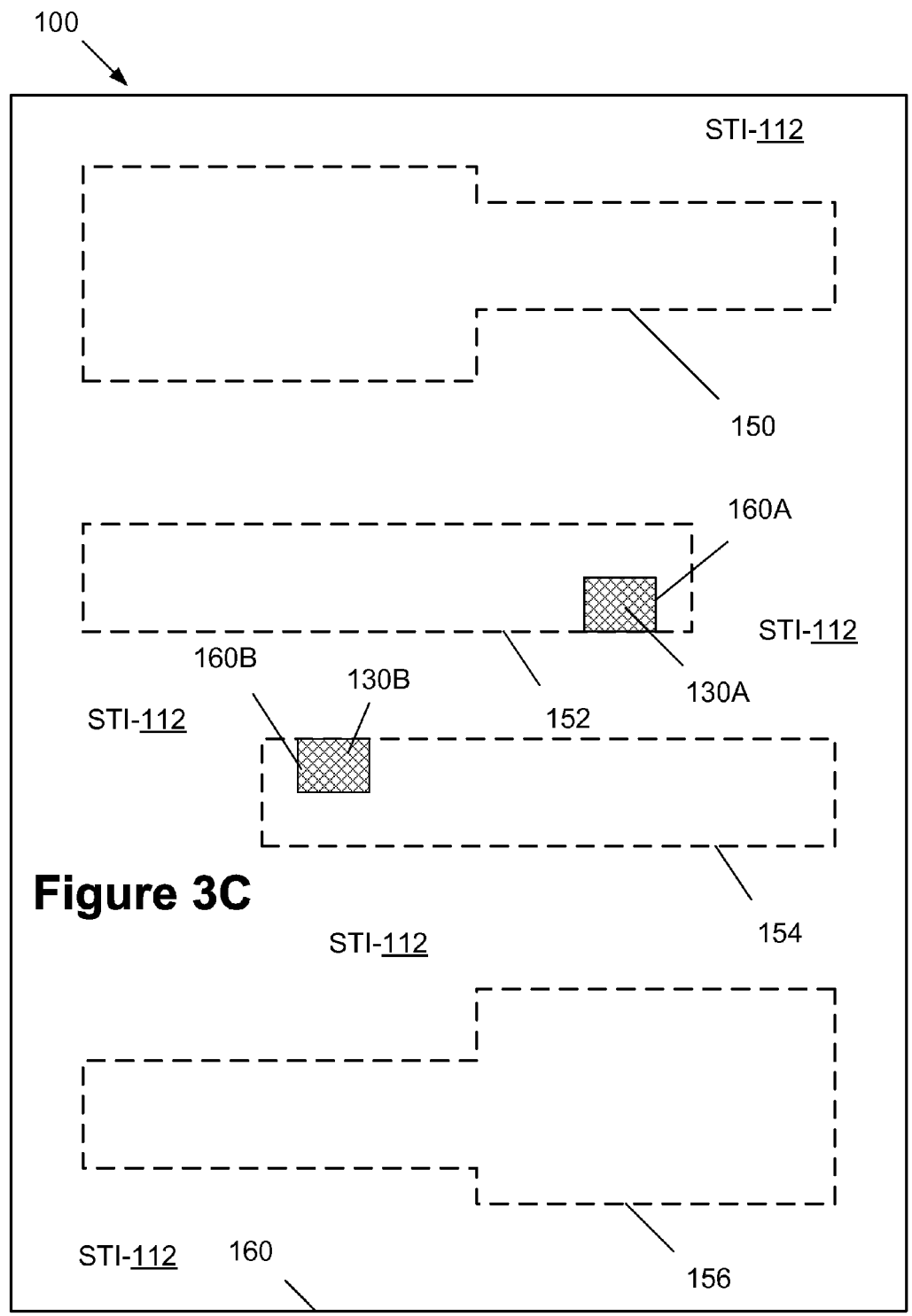

FIGS. 3A-3E depict one illustrative embodiment of a method of forming the novel contact structure 100 disclosed herein on an illustrative SRAM device wherein the gate structures of the transistors of the SRAM device are formed using a so-called "gate-first" technique. Initially, as shown in FIG. 3A, the illustrative isolation regions 112 are formed in a semiconducting substrate 110 (not shown in FIG. 3A) to thereby define the active regions 150, 152, 154 and 156. Thereafter, as shown in FIG. 3B, the gate insulation layer 130, comprised of a thermally grown layer of silicon dioxide, is formed on the active regions 150, 152, 154 and 156 by performing a thermal growth process. As shown in FIG. 3C, after the gate insulation layer 130 is formed, a patterned masking layer 160, e.g., a patterned photoresist mask, with patterned openings 160A, 160B, is formed above the gate insulation layer 130. The openings 160A, 160B in the patterned masking layer 160 expose portions 130A, 130B of the underlying gate insulation layer 130. Next, as shown in FIG. 3D, an etching process is performed through the patterned mask layer 160 to remove the exposed portions 130A, 130B of the gate insulation layer 130 and thereby expose portions 152A, 154A of the active regions 152, 154, respectively.

Figure 3E:
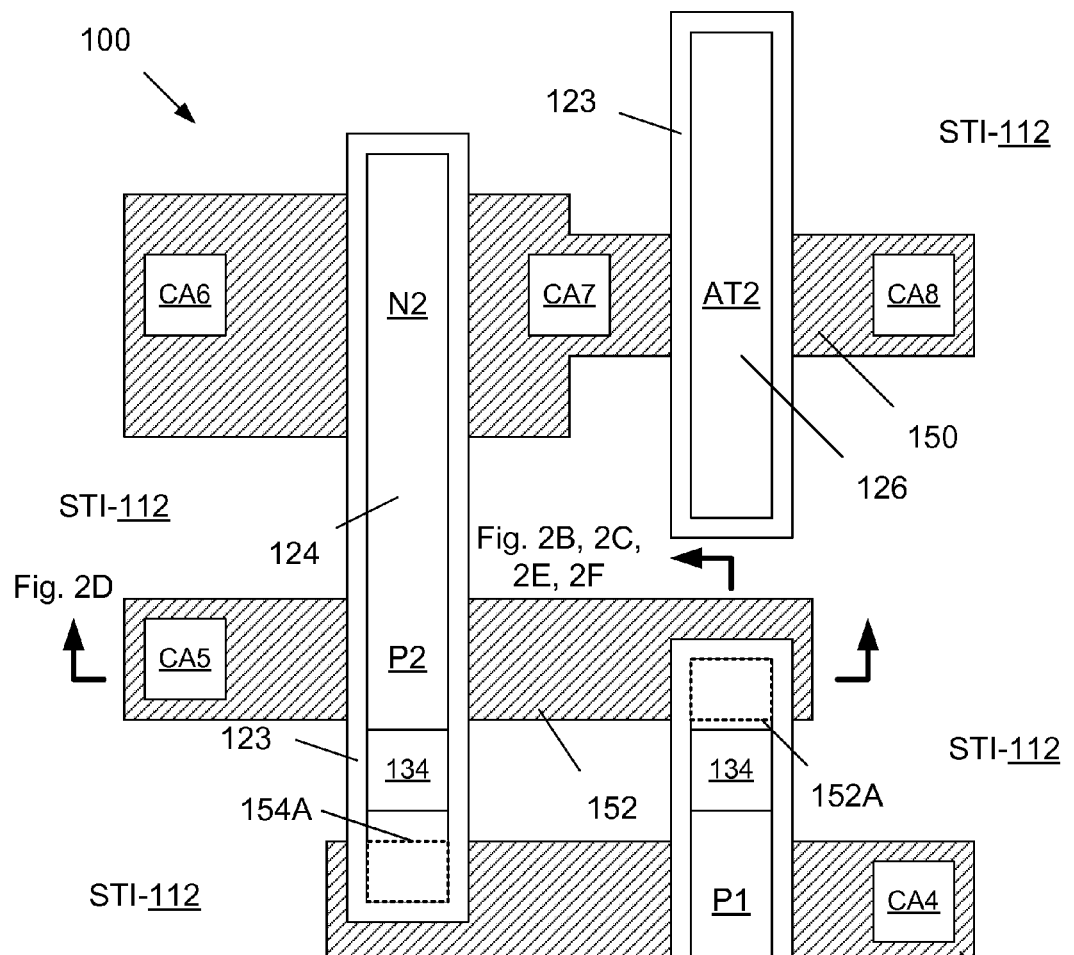
Figure 3E:
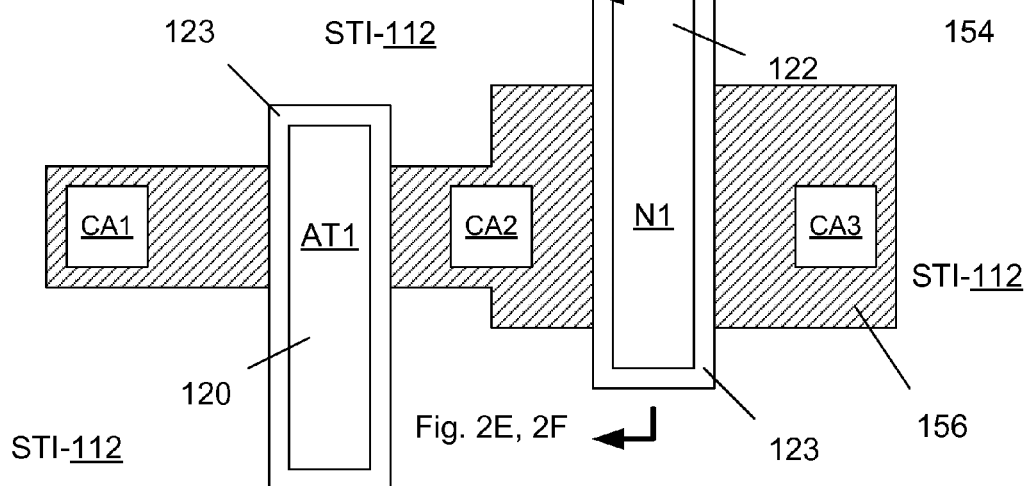

Next, with reference to FIGS. 2B and 3E, the gate electrode 131 portion of the conductive gate structures 120, 122, 124 and 126 is formed above the remaining portions of the gate insulation layer 130. During this process, the surface 131S of the gate electrode 131 of the conductive gate structures 122, 124 is formed so as to conductively contact the exposed portions 152A, 154A, respectively, of the active regions 152, 154. The doped regions 129 (see FIG. 2B) that underlie the contact surface 131S may be formed using one of two illustrative techniques—ion implantation or diffusion. In one embodiment, after the portions 152A, 154A are exposed (see FIG. 3D), and prior to the deposition of the material for the conductive gate electrode 131, an ion implantation process may be performed through the patterned mask layer 160 to implant dopant materials into the exposed portions of the active region 152 to thereby form the doped regions 129. Such an ion implantation process may be performed using a dopant dose that falls within the range of about $10E^{14}$-$10E^{16}$ ions/$cm^2$, and it may be performed at an energy level that falls within the range of about 2-20 keV. Note that using the ion implant technique, the doped region 129 is formed in the active region 152 prior to forming the extension and source/drain implant regions. As another alternative, the material for the conductive gate electrode 131 may be formed using an in situ doping deposition process wherein dopant materials are introduced into the layer of gate electrode material, e.g., polysilicon, as it is being formed. If the in situ approach is taken, the doped region 129 will be formed as a result of dopant materials migrating from the doped gate electrode 131 as subsequent processing operations, particularly subsequent heating or anneal processes, are performed to complete the manufacture of the SRAM device. In one illustrative example, irrespective of the manner in which it is formed, the doped region 129 may have a dopant concentration that falls within the range of about $10E^{20}$-$10E^{21}$ dopants/$cm^3$.

In FIG. 3E, the conductive gate electrode 131 of the gate structures 120, 122, 124 and 126 has been formed above the isolation regions 112, the active regions 150, 152, 154 and 156, and in contact with the exposed portions 152A, 154A of the active regions 152, 154, respectively. After the gate structures 120, 122, 124 and 126 are formed, a plurality of so-called extension ion implant processes are performed (using the appropriate dopant atoms) to form so-called extension implant regions (not shown) in the active regions 150, 152, 154 and 156 adjacent the corresponding gate structures 120, 122, 124 and 126 for the various transistors. The masking layers used in such ion implantation processes are not depicted in the attached drawings so as not to obscure the presently disclosed inventions. Then, the sidewall spacer 123, made of a material such as silicon nitride, is typically formed adjacent the gate structures 120, 122, 124 and 126 by depositing a layer of spacer material and performing an anisotropic etching process. After the spacer 123 is formed, multiple ion implantation processes may be performed (using the appropriate dopant atoms) to form so-called source/drain implant regions (not shown) in the active regions 150, 152, 154 and 156 adjacent the gate structures 120, 122, 124 and 126 for the various transistors. The extension implant process and the source/drain implant process result in the formation of the illustratively depicted source/drain regions 127 shown in FIGS. 2B-2F. FIG. 3E depicts where the exposed portions of the active region 152A, 154A were initially located prior to the formation of the gate electrodes 131. After the implant regions 127 are formed, the device 100 will be subjected to a source/drain anneal process to activate the implanted dopant material and to repair any damage to the lattice structure of the substrate 110 resulting from the implant processes. In the case where the gate electrode structure 131 is doped in situ, the source/drain process may be sufficient to cause the dopant material in the doped gate electrode 131 to diffuse from the doped gate electrode 131 to thereby form the doped region 129.

Figure 4A:
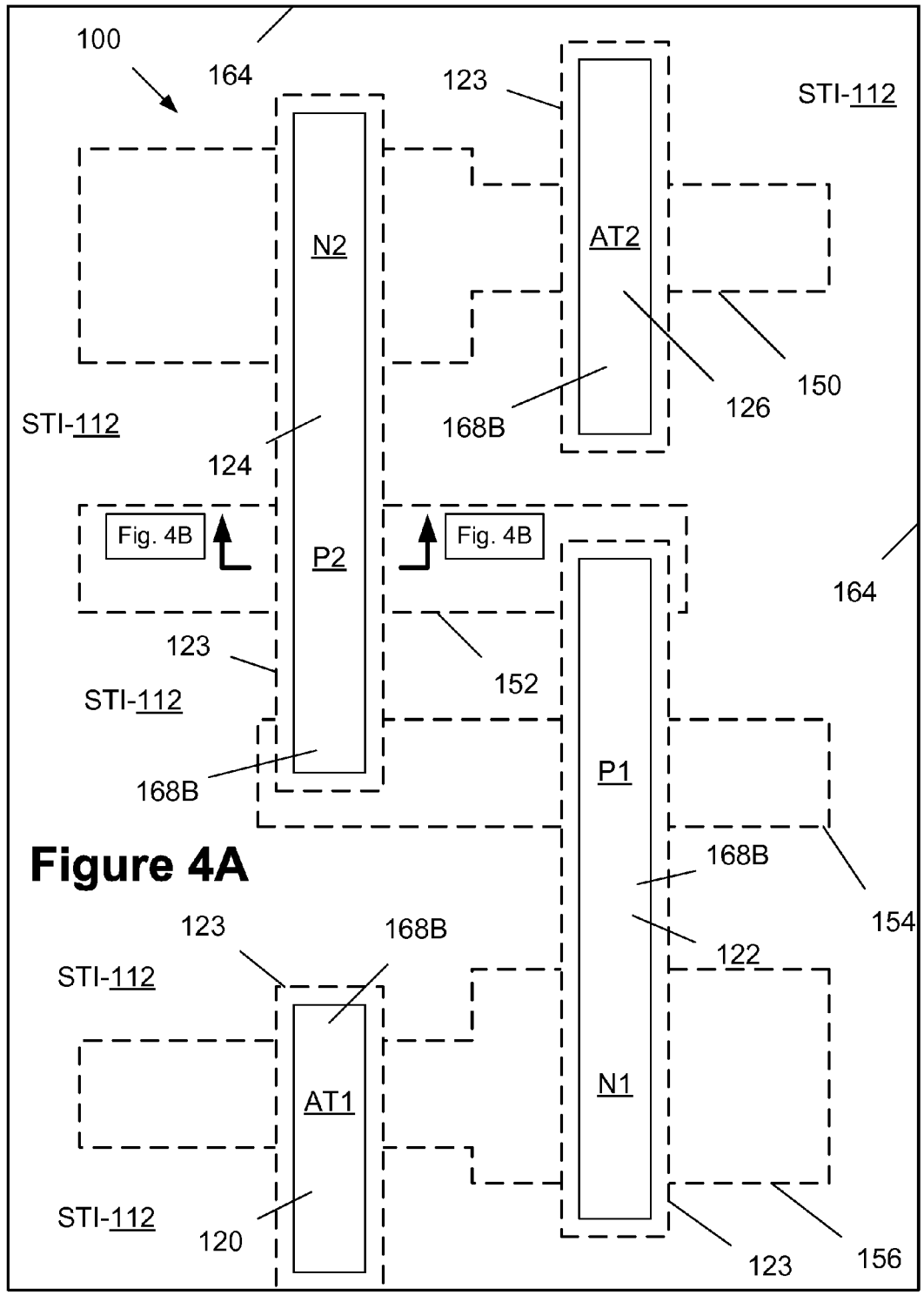
Figure 4B:
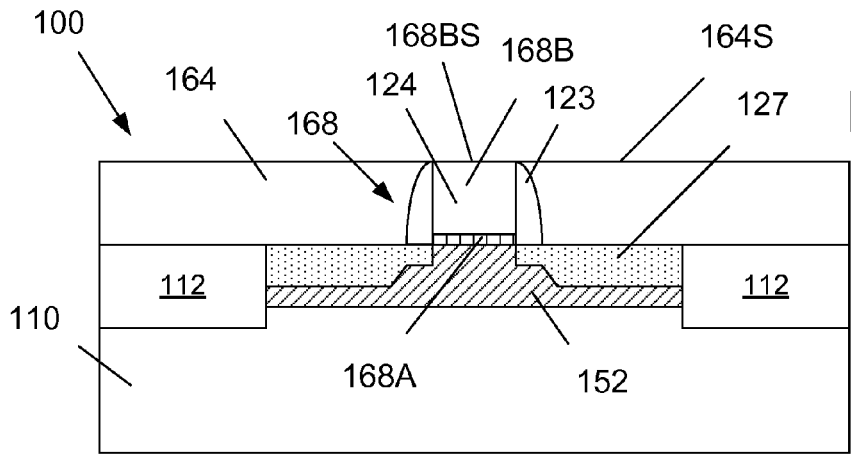

FIGS. 4A-4I depict one illustrative embodiment of a method of forming the novel contact structure 100 disclosed herein on an illustrative SRAM device wherein the gate structures of the transistors of the SRAM device are formed using a so-called "gate-last" or "replacement gate" technique. With reference to FIGS. 4A-4B, the illustrative SRAM device is depicted at the point of fabrication wherein (1) the illustrative isolation regions 112 have been formed in the semiconducting substrate 110 (not shown in FIG. 3A) to thereby define the active regions 150, 152, 154 and 156, (2) sacrificial gate structures 168 have been formed; (3) extension implant regions (part of doped region 127) have been formed in the substrate 110 adjacent the sacrificial gate structures 168; (4) the sidewall spacer 123 has been formed adjacent the sacrificial gate structures 168; (5) source/drain implant regions (part of doped region 127) have been formed in the substrate 110; and (6) a layer of insulating material 164 has been formed above the substrate 110. The sacrificial gate structure 168 is comprised of a sacrificial gate insulation layer 168A, e.g., silicon dioxide, and a sacrificial gate electrode 168B, e.g., polysilicon. As shown in FIG. 4B, a polishing process has been performed to planarize the upper surface 164S of the layer of insulating material 164 with the upper surface 168BS of the sacrificial gate electrode 168B. The polishing process exposes the gate electrode 168B for further processing. As noted above, illustrative source/drain regions 127 have also been formed in the active regions of the device and the source/drain anneal process has typically been performed at this point in the process flow.

Figure 4D:
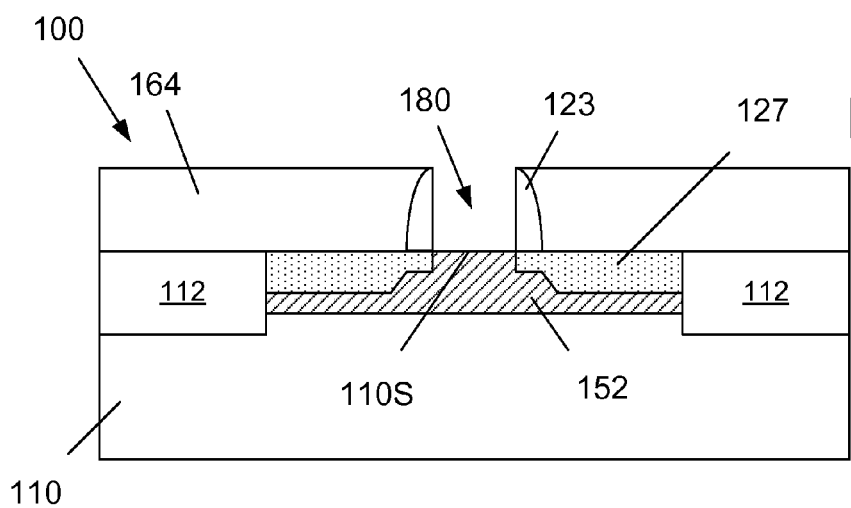
Figure 4F:
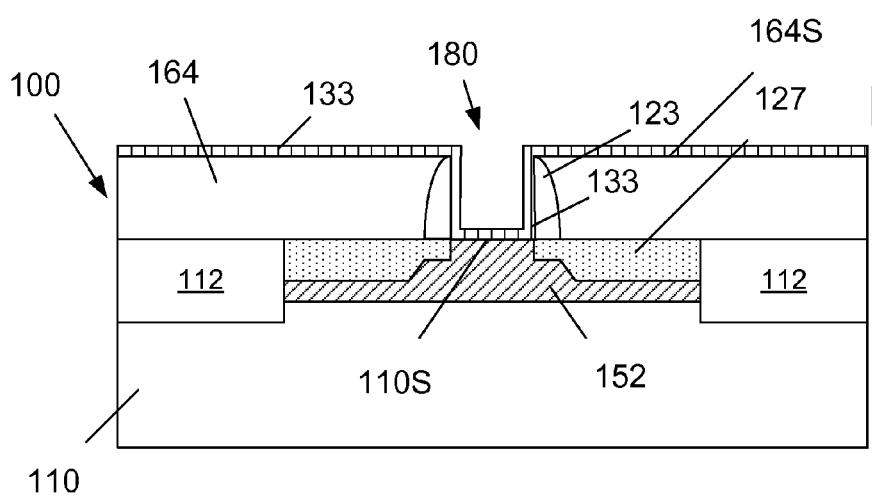
Figure 4C:
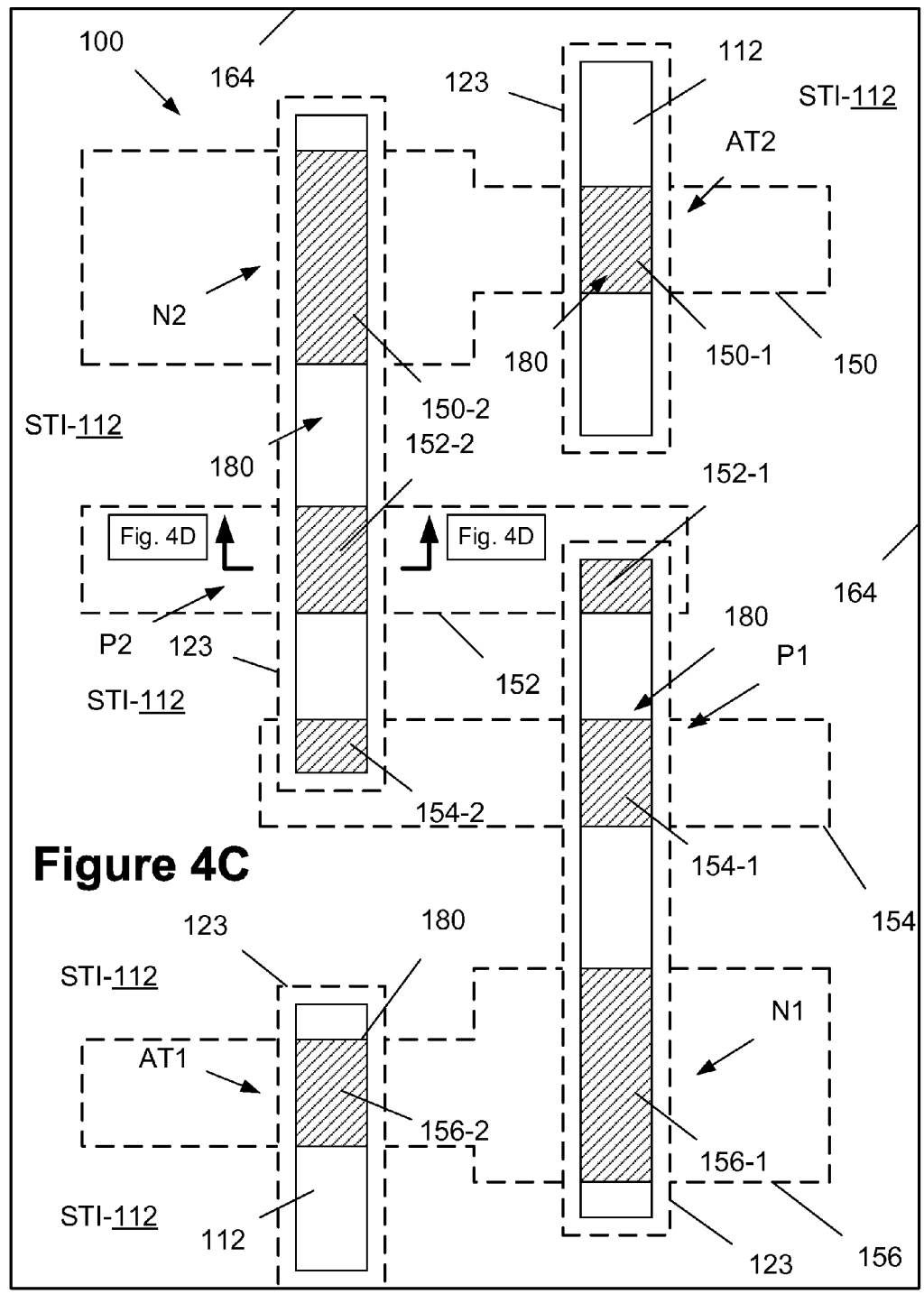

FIGS. 4C-4D, depict the SRAM device after one or more etching processes have been performed to remove the sacrificial gate structure 168 and thereby define a gate cavity 180 that is laterally defined by the inner walls of the spacers 123. The gate cavity 180 exposes a portion of the surface 110S of the substrate 110 and thereby the portions of the active regions 150, 152, 154 and 156 positioned under the gate cavities 180. More specifically, formation of the gate cavities 180 exposes portions 150-1, 150-2 of the active region 150, portions 152-1, 152-2 of the active region 152, portions 154-1, 154-2 of the active region 154 and portions 156-1, 156-2 of the active region 156. In general, replacement gate structures 190 will be formed in the gate cavities 180. The replacement gate structures 190 may be comprised of a variety of different materials and they typically include one to more layers of metal. In one illustrative embodiment, the replacement gate structures 190 are comprised of the previously described high-k gate insulation layer 133 and at least the first and second metal layers 135, 137 as well as a bulk layer of metal 191, such as a bulk layer of aluminum, as described more fully below (see FIG. 4I).

FIGS. 4E-4F depict the SRAM device at an early stage of the replacement gate process. Initially, the high-k gate insulation layer 133 may be deposited in the gate cavities 180 and above the upper surface 164S of the layer of insulating material 164. So as to facilitate an understanding of the process flow, in FIG. 4E, only the portions of the high-k gate insulation layer 133 that is formed on the bottom of the cavities 180 is depicted. FIG. 4F shows the formation of the high-k gate insulation layer 133 along the sidewalls of the gate cavities 180 and on top of the layer of insulating material 164.

Figure 4G:
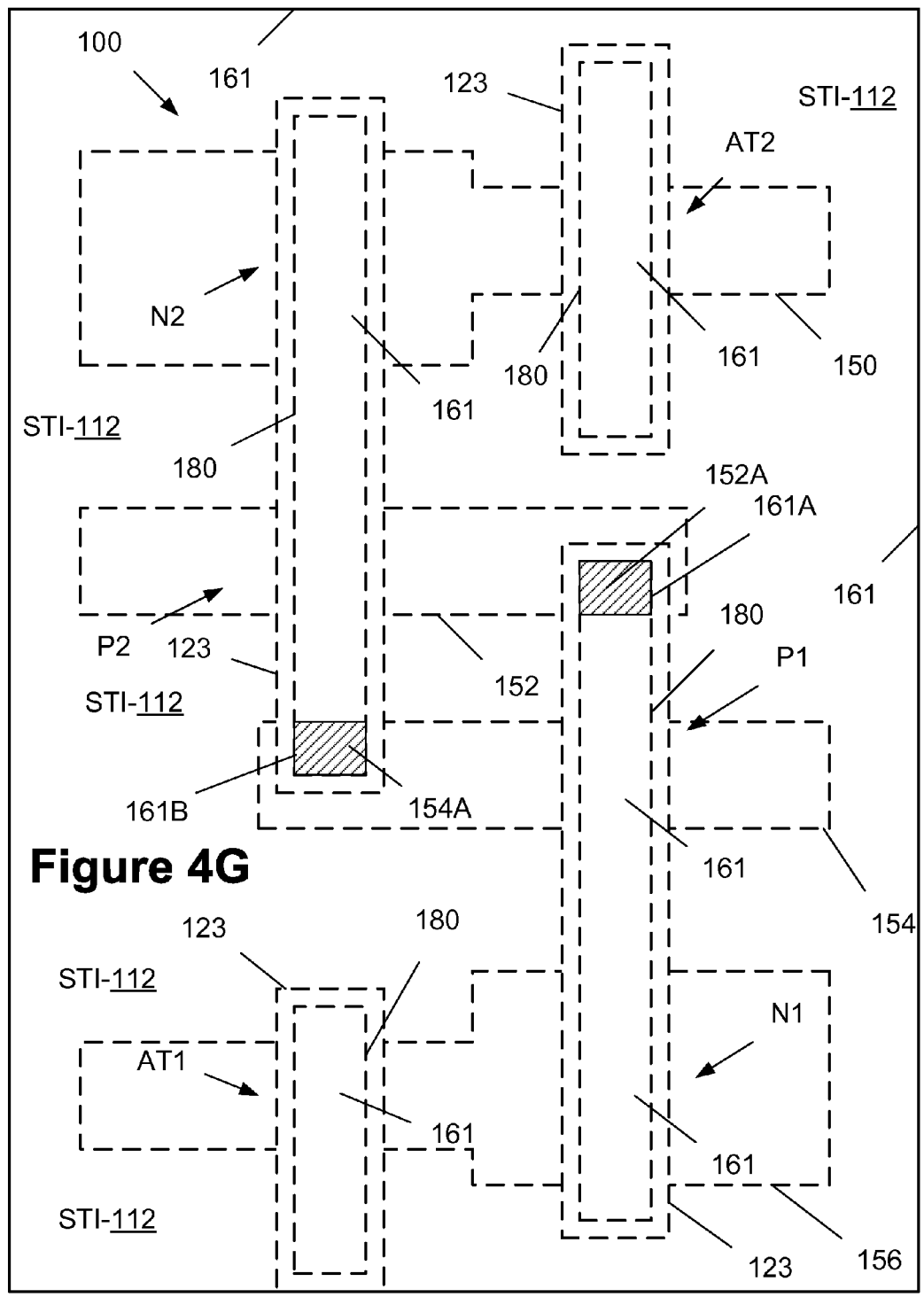

As shown in FIG. 4G, after the high-k gate insulation layer 133 is deposited in the gate cavities 180, a patterned masking layer 161, such as a patterned photoresist mask similar to the masking layer 160 shown in FIG. 3C, may be formed above the high-k gate insulation layer 133. The patterned masking layer 161 has openings 161A, 161B that expose portions of the high-k gate insulation layer 133. Thereafter, an etching process is performed through the patterned mask layer 161 to remove the exposed portions of the high-k gate insulation layer 133 and thereby expose portions 152A, 154A of the active regions 152, 154, respectively. At this point, if desired, an ion implantation process may be performed to form the doped regions 129 in the exposed portions of the substrate 110.

Figure 4H:
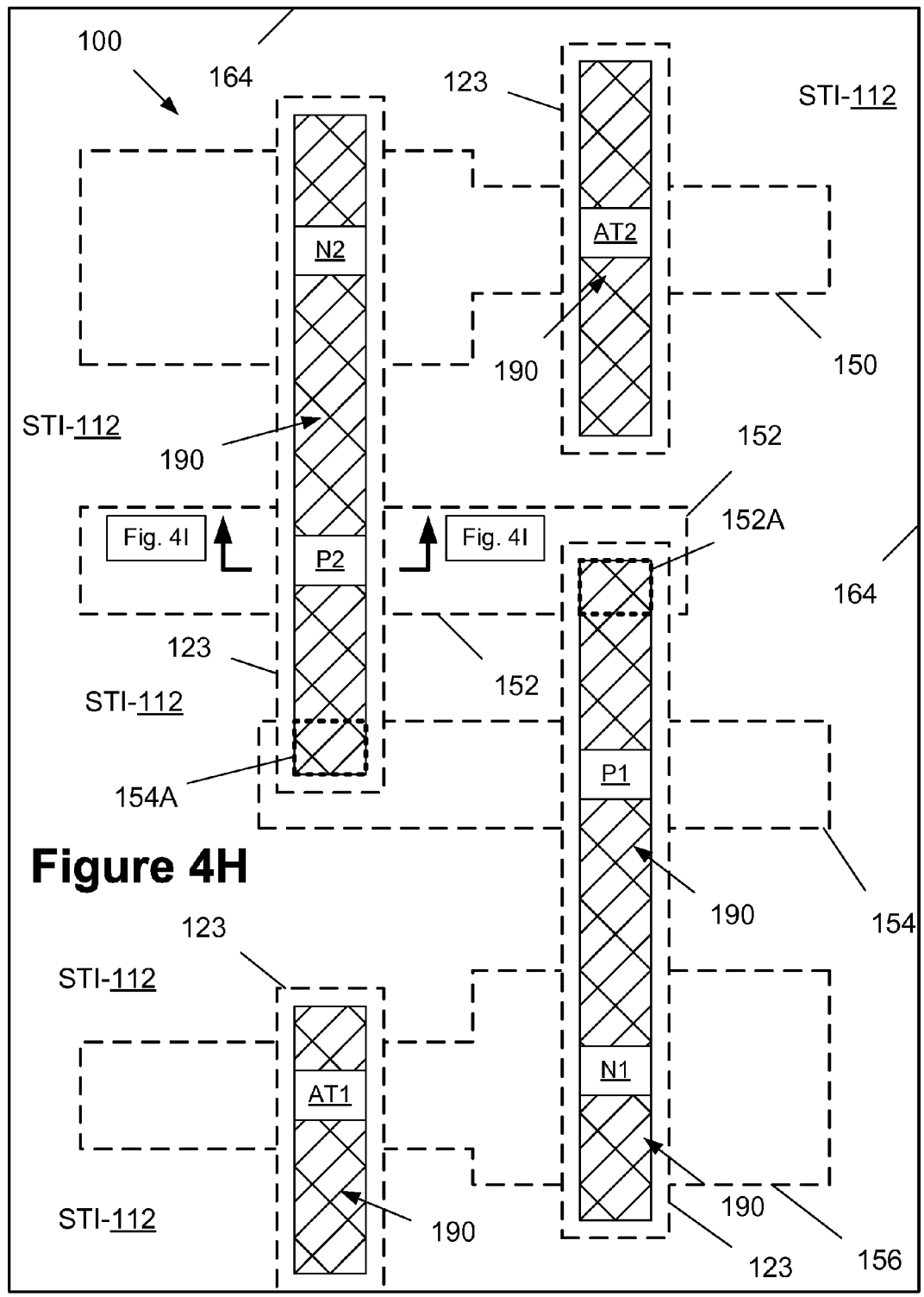

FIGS. 4H-4I depict the SRAM device after the patterned mask layer 161 was removed and after various process operations were performed to complete the formation of the schematically depicted replacement gate structures 190. The various layers of material from which the replacement gate structure 190 is formed may be deposited above the layer of insulating material 164, above the high-k gate insulating material 133 and in the gate cavities 180. Thereafter, one or more CMP processes are performed to remove excess portions of the gate insulation layer 133, the first metal layer 135, the second metal layer 137 and the bulk metal layer 191 positioned outside of the gate cavity 180 to thereby define the replacement gate structure 190. As will be recognized by those skilled in the art after a complete reading of the present application, the replacement gate structure 190 disclosed herein is intended to be representative in nature, i.e., the replacement gate structure 190 may be comprised of a variety of different materials. In one example, the high-k gate insulation layer 133 may be a layer of hafnium oxide, the first metal layer 135 may be a layer of titanium nitride and the second metal layer 137 may be a layer of tantalum nitride. Thus, the present invention should not be considered to be limited to the illustrative examples disclosed herein.

In one illustrative example, the first metal layer 135 conductively contacts the active region 152, as shown in FIG. 2F. In that example, the various layers of conductive material that are used to form the replacement gate electrode 190B may simply be deposited in the gate cavities 180 after the high-k gate insulation layer 133 is patterned to expose the active region 152. In cases where it is desired that a layer of material above the first metal layer 135 conductively contact the active region 152, then one or more etching processes will need to be performed to allow the desired layer of material to conductively contact the active region 152. For example, in the situation depicted in FIG. 2E, where the second metal layer 137 conductively contacts the active region 152, a portion of the first metal layer 135 will be removed prior to depositing the second metal layer 137.

As will be appreciated by those skilled in the art after a complete reading of the present application, the novel contact structure 100 disclosed herein may provide significant advantages. By eliminating the traditional CAREC contact structure, the various conductive contacts for the device may all be of substantially the same size. Such an arrangement provides the opportunity to optimize lithography, etching and contact fill processes for only a single, uniform sized contact. Such optimization may reduce product defects and increase processing efficiencies. Additionally, the removal of the relatively large CAREC contact structure from a typical SRAM device may provide opportunities for further scaling of device dimensions. Lastly, in cases where the doped region 129 is formed, the novel contact structure 100 may reduce or stop undesirable leakage currents.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A device, comprising:
   first and second spaced-apart active regions positioned in a semiconducting substrate;
   an isolation region positioned between and separating said first and second spaced-apart active regions;
   a layer of gate insulation material positioned on said first active region; and
   a first conductive line feature extending continuously from said first active region and across said isolation region to said second active region, said first conductive line feature comprising a first portion that is positioned directly above said layer of gate insulation material positioned on said first active region and a second portion that conductively contacts said second active region.

2. The device of claim 1, wherein said first conductive line feature comprises polysilicon.

3. The device of claim 1, wherein said first conductive line feature comprises at least one layer of metal and a layer of polysilicon, and wherein one of said at least one layer of metal and said layer of polysilicon conductively contacts said second active region.

4. The device of claim 1, wherein said first conductive line feature comprises a plurality of layers of metal, and wherein at least one of said plurality of layers of metal conductively contacts said second active region.

5. The device of claim 1, wherein said first conductive line feature is a gate electrode for a pull-up transistor of an SRAM device, said pull-up transistor being positioned in and above said first active region.

6. The device of claim 1, further comprising a third active region that is spaced apart from said first and second active regions and separated from said first and second active regions by said isolation region, wherein said first conductive line feature is a shared gate electrode for a pull-up transistor and a pull-down transistor of an SRAM device, said pull-up transistor being positioned in and above said first active region and said pull-down transistor being positioned in and above said third active region.

7. The device of claim 1, further comprising a pull-up transistor for an SRAM device, wherein said pull-up transistor is positioned in and above said second active region and comprises a second conductive line feature that is a gate electrode for said pull-up transistor.

8. The device of claim 1, wherein said first conductive line feature has an end surface that is positioned above said second active region, the device further comprising a sidewall spacer positioned on said end surface of said first conductive line feature.

9. The device of claim 1, further comprising a doped source/drain region positioned in said second active region and a contact doped region positioned in said second active region under said second portion of said first conductive line feature.

10. The device of claim 1, further comprising a conductive contact that is conductively coupled to an upper surface of said first conductive line feature.

11. A device, comprising:
    first and second spaced-apart active regions positioned in a semiconducting substrate;
    an isolation region positioned between and separating said first and second spaced-apart active regions;
    a layer of gate insulation material positioned on said first active region;
    a first conductive line feature extending continuously from said first active region and across said isolation region to said second active region, said first conductive line feature comprising a first portion positioned directly above said layer of gate insulation material positioned on said first active region and a second portion that conductively contacts said second active region, said first conductive line feature having an end surface that is positioned above said second active region;
    a sidewall spacer positioned on said end surface of said first conductive line feature;
    a doped source/drain region positioned in said second active region; and
    a contact doped region positioned in said second active region under said second portion of said first conductive line feature.

12. The device of claim 11, wherein said first conductive line feature is a gate electrode for a pull-up transistor of an SRAM device, said pull-up transistor being positioned in and above said first active region.

13. The device of claim 11, further comprising a third active region that is spaced apart from said first and second active regions and separated from said first and second active regions by said isolation region, wherein said first conductive line feature is a shared gate electrode for a pull-up transistor and a pull-down transistor of an SRAM device, said pull-up transistor being positioned in and above said first active region and said pull-down transistor in and above said third active region.

14. The device of claim 11, further comprising a pull-up transistor for an SRAM device, wherein said pull-up transistor is positioned in and above said second active region and comprises a second conductive line feature that is a gate electrode for said pull-up transistor.

15. The device of claim 11, further comprising a conductive contact that is conductively coupled to an upper surface of said first conductive line feature.

16. An SRAM device, comprising:
    first and second spaced-apart active regions positioned in a semiconducting substrate;
    an isolation region positioned between and separating said first and second spaced-apart active regions;
    a first pull-up transistor positioned in and above said first active region, said first pull-up transistor comprising a first gate insulation layer positioned on said first active region;
    a first conductive line feature extending continuously from said first active region and across said isolation region to said second active region, said first conductive line feature comprising at least one layer of conductive material, wherein a first portion of said first conductive line feature is positioned directly above said first gate insulation layer of said first pull-up transistor positioned on said first active region and a second portion of said first conductive line feature conductively contacts said second active region;
    a second pull-up transistor positioned in and above said second active region, said second pull-up transistor comprising a second gate insulation layer positioned on said second active region; and
    a second conductive line feature extending continuously from said second active region and across said isolation region to said first active region, said second conductive line feature comprising at least one layer of conductive material, wherein a first portion of said second conductive line feature is positioned directly above said second gate insulation layer of said second pull-up transistor positioned on said second active region and a second portion of said second conductive line feature conductively contacts said first active region.

17. The device of claim 16, wherein said first and second conductive line features comprise polysilicon.

18. The device of claim 16, wherein said first and second conductive line features each comprise at least one layer of metal and a layer of polysilicon, and wherein one of said at least one layer of metal and said layer of polysilicon conductively contacts said second and first active regions, respectively.

19. The device of claim 16, wherein said first and second conductive line features each comprise a plurality of layers of metal, and wherein at least one of said plurality of layers of metal comprising said first and second conductive line features conductively contacts said second and first active regions, respectively.

20. The device of claim 16, further comprising a third active region that is spaced apart from said first and second active regions and a first pull-down transistor of said SRAM device that is positioned in and above said third active region, wherein said first conductive line feature is a shared gate electrode for said first pull-up transistor and said first pull-down transistor of said SRAM device.

21. The device of claim 20, further comprising a fourth active region that is spaced apart from said first and second active regions and a second pull-down transistor of said SRAM device that is positioned in and above said fourth active region, wherein said second conductive line feature is a shared gate electrode for said second pull-up transistor and said second pull-down transistor of said SRAM device.

22. The device of claim 16, wherein said first conductive line feature has an end surface that is positioned above said second active region, the device further comprising a sidewall spacer positioned on said end surface of said first conductive line feature.

23. The device of claim 16, further comprising a doped source/drain region positioned in said second active region and a contact doped region positioned in said second active region under said second portion of said first conductive line feature.

24. The device of claim 16, further comprising a conductive contact that is conductively coupled to an upper surface of said first conductive line feature.

* * * * *